United States Patent
Jo et al.

(10) Patent No.: US 11,393,893 B2
(45) Date of Patent: Jul. 19, 2022

(54) DISPLAY DEVICE

(71) Applicant: Samsung Display Co., Ltd., Yongin-si (KR)

(72) Inventors: Junyoung Jo, Yongin-si (KR);
Byungsun Kim, Yongin-si (KR);
Minhee Choi, Yongin-si (KR);
Minchae Kwak, Yongin-si (KR); Ilgoo Youn, Yongin-si (KR); Jieun Lee, Yongin-si (KR); Seunghan Jo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 90 days.

(21) Appl. No.: 16/905,704

(22) Filed: Jun. 18, 2020

(65) Prior Publication Data
US 2021/0036088 A1     Feb. 4, 2021

(30) Foreign Application Priority Data
Jul. 29, 2019  (KR) .................. 10-2019-0092035

(51) Int. Cl.
*H01L 27/32* (2006.01)
*H01L 51/00* (2006.01)
*G09G 3/3233* (2016.01)

(52) U.S. Cl.
CPC ....... *H01L 27/3276* (2013.01); *G09G 3/3233* (2013.01); *H01L 51/0096* (2013.01)

(58) Field of Classification Search
CPC ............ H01L 27/3276; H01L 51/0096; G09G 3/3233; G09G 2310/0281; G09G 2310/0283; G11C 19/28
See application file for complete search history.

(56) References Cited

U.S. PATENT DOCUMENTS

| | | | |
|---|---|---|---|
| 8,139,194 B2 | 3/2012 | Yamamoto et al. | |
| 8,451,414 B2 | 5/2013 | Nonaka | |
| 9,626,900 B2* | 4/2017 | Anzai | G09G 3/2096 |
| 9,887,256 B2* | 2/2018 | Kim | H01L 27/3265 |
| 9,965,995 B2 | 5/2018 | Chen et al. | |
| 9,978,314 B2* | 5/2018 | Bae | G11C 19/287 |
| 10,134,825 B2* | 11/2018 | Shin | G09G 3/3233 |
| 10,325,559 B2 | 6/2019 | Lee et al. | |
| 10,770,014 B2* | 9/2020 | Yeh | G09G 3/3266 |
| 11,132,953 B2* | 9/2021 | Yamada | G09G 3/3275 |
| 2008/0018557 A1 | 1/2008 | Maeda | |
| 2008/0266210 A1* | 10/2008 | Nonaka | G11C 19/28 345/55 |

(Continued)

FOREIGN PATENT DOCUMENTS

| | | |
|---|---|---|
| KR | 10-2009-0041336 A | 4/2009 |
| KR | 10-2014-0109261 A | 9/2014 |

(Continued)

*Primary Examiner* — Sardis F Azongha
(74) *Attorney, Agent, or Firm* — Lewis Roca Rothgerber Christie LLP

(57) ABSTRACT

A display device includes: a plurality of pixels arranged in a display area that has a non-quadrangular shape; and a plurality of driving circuits arranged in a peripheral area outside the display area and connected to the plurality of pixels, wherein a plurality of sub-driving circuits included in each of the plurality of driving circuits are distributed in a line in the peripheral area.

20 Claims, 24 Drawing Sheets

(56) References Cited

U.S. PATENT DOCUMENTS

| | | | |
|---|---|---|---|
| 2010/0141570 A1* | 6/2010 | Horiuchi | G09G 3/3611 |
| | | | 345/100 |
| 2014/0253419 A1 | 9/2014 | Tanada | |
| 2016/0240141 A1* | 8/2016 | Lee | G09G 3/20 |
| 2016/0351098 A1 | 12/2016 | Lin et al. | |
| 2017/0178563 A1 | 6/2017 | Anzai et al. | |
| 2018/0075810 A1 | 3/2018 | Kim et al. | |
| 2018/0090091 A1 | 3/2018 | Sim et al. | |
| 2021/0027718 A1* | 1/2021 | Yokoyama | G02F 1/1368 |

FOREIGN PATENT DOCUMENTS

| | | |
|---|---|---|
| KR | 10-2016-0099770 A | 8/2016 |
| KR | 10-2018-0030314 A | 3/2018 |
| KR | 10-2018-0035966 A | 4/2018 |

\* cited by examiner

DISPLAY DEVICE

CROSS-REFERENCE TO RELATED APPLICATION

This application claims priority to and the benefit of Korean Patent Application No. 10-2019-0092035, filed on Jul. 29, 2019, in the Korean Intellectual Property Office, the entire content of which is incorporated herein by reference.

BACKGROUND

1. Field

One or more embodiments relate to a display device.

2. Description of Related Art

With the rapid development of the display field for visually expressing diverse electric signal information, various display devices having excellent characteristics such as light weight, thinness, and low power consumption have been introduced. A display device may include a plurality of pixels arranged in a display area and driving circuits, which drive the pixels, arranged around the display area.

SUMMARY

One or more embodiments include a display device that may reduce a dead area and increase an area of a display area.

However, aspects and features of embodiments of the present disclosure are not limited to the above aspects and features, and other aspects and features that are not mentioned herein will be clearly understood by those of ordinary skill in the art from the description of the present disclosure.

Additional aspects and features of embodiments will be set forth in part in the description which follows and, in part, will be apparent from the description, or may be learned by practice of the presented embodiments of the disclosure.

According to one or more embodiments, a display device may include a plurality of pixels arranged in a display area that has a non-quadrangular shape, a first driving circuit including a plurality of first sub-driving circuits each to output a first signal to the plurality of pixels, a second driving circuit including a plurality of second sub-driving circuits each to output a second signal to the plurality of pixels, and a third driving circuit including a plurality of third sub-driving circuits each to output a third signal to the plurality of pixels. A peripheral area outside the display area may include a first peripheral area and a second peripheral area that are symmetrical to each other with respect to the display area therebetween. The plurality of first sub-driving circuits and the plurality of second sub-driving circuits may be alternately arranged in a line in the first peripheral area. The plurality of third sub-driving circuits may be arranged in a line in the second peripheral area. A sum of a size of an area in which one of the plurality of first sub-driving circuits is arranged and a size of an area in which one of the plurality of second sub-driving circuits is arranged may be equal to a size of an area in which one of the plurality of third sub-driving circuits is arranged.

Each of the plurality of pixels may include a first thin film transistor, a second thin film transistor, and a third thin film transistor, the first thin film transistor and the second thin film transistor each including a silicon semiconductor, and the third thin film transistor including an oxide semiconductor.

The plurality of first sub-driving circuits may be connected to a first signal line connected to a gate electrode of the first thin film transistor and extend in a first direction. The plurality of second sub-driving circuits may be connected to a second signal line connected to a gate electrode of the second thin film transistor and extend in the first direction. The plurality of third sub-driving circuits may be connected to a third signal line connected to a gate electrode of the third thin film transistor and extend in the first direction.

Each of the plurality of pixels may be connected to a fourth signal line extending in a second direction intersecting the first direction. The display device may further include a fourth driving circuit including a plurality of fourth sub-driving circuits that output a fourth signal to one end portion of the fourth signal lines, and a fifth driving circuit including a plurality of fifth sub-driving circuits that output a fifth signal to another end portion of the fourth signal lines. The plurality of fourth sub-driving circuits and the plurality of fifth sub-driving circuits may be distributed in the first peripheral area and the second peripheral area.

The plurality of fourth sub-driving circuits and the plurality of fifth sub-driving circuits may be distributed between the plurality of first to third sub-driving circuits.

The plurality of fourth sub-driving circuits and the plurality of fifth sub-driving circuits may be arranged between pairs of the first sub-driving circuit and the second sub-driving circuit.

The display device may further include a plurality of output lines arranged in the peripheral area and connecting the first to fourth signal lines to the plurality of first to fifth driving circuits.

Each of the plurality of output lines may include a portion extending in a direction toward a center of the display area.

The peripheral area may have a shape corresponding to a shape of an edge of the display area.

The peripheral area may include an area having a shape corresponding to a shape of an edge of the display area, and an area having the shape different from the shape of the edge of the display area.

A width of the area of the peripheral area having a shape different from the shape of the edge of the display area may be less than a width of the area of the peripheral area having a shape corresponding to the shape of the edge of the display area.

According to one or more embodiments, a display device may include a plurality of signal lines extending in a first direction and arranged in a display area that has a non-quadrangular shape. A plurality of driving circuits may be arranged in a peripheral area outside the display area and to output a signal to the plurality of signal lines. A plurality of output lines may be arranged in the peripheral area and connect the plurality of driving circuits to the plurality of signal lines. A plurality of sub-driving circuits included in each of the plurality of driving circuits may be arranged in a line in the peripheral area. Each of the plurality of output lines may include a portion extending in a direction toward a center of the display area.

The plurality of signal lines may include a plurality of first signal lines, a plurality of second signal lines, and a plurality of third signal lines. The plurality of sub-driving circuits may include a plurality of first sub-driving circuits to output a first signal to the plurality of first signal lines, a plurality of second sub-driving circuits to output a second signal to the plurality of second signal lines, and a plurality of third sub-driving circuits to output a third signal to the plurality of third signal lines. The peripheral area may include a first peripheral area and a second peripheral area that are symmetrical to each other with respect to the display area therebetween. The plurality of first sub-driving circuits and the plurality of second sub-driving circuits may be alternately arranged in a line in the first peripheral area. The plurality of third sub-driving circuits may be arranged in a line in the second peripheral area. A sum of a size of an area in which one of the plurality of first sub-driving circuits is arranged and a size of an area in which one of the plurality of second sub-driving circuits is arranged may be equal to a size of an area in which one of the plurality of third sub-driving circuits is arranged.

The plurality of signal lines may further include fourth signal lines extending in a second direction intersecting the first direction and arranged in the display area. The plurality of sub-driving circuits may further include a plurality of fourth sub-driving circuits to output a fourth signal to an end portion of the fourth signal lines, and a plurality of fifth sub-driving circuits to output a fifth signal to another end portion of the fourth signal lines. The plurality of fourth sub-driving circuits and the plurality of fifth sub-driving circuits may be distributed in the first peripheral area and the second peripheral area.

The plurality of fourth sub-driving circuits and the plurality of fifth sub-driving circuits may be distributed between the plurality of first to third sub-driving circuits.

The plurality of fourth sub-driving circuits and the plurality of fifth sub-driving circuits may be arranged between pairs of the first sub-driving circuit and the second sub-driving circuit.

The peripheral area may have a shape corresponding to a shape of an edge of the display area.

The peripheral area may include an area having a shape corresponding to a shape of an edge of the display area, and an area having a shape different from the shape of the edge of the display area.

A width of the area of the peripheral area having a shape different from the shape of the edge of the display area may be less than a width of the area of the peripheral area having a shape corresponding to the shape of the edge of the display area.

A plurality of pixels connected to the plurality of signal lines may be arranged in the display area. Each of the plurality of pixels may include a first thin film transistor, a second thin film transistor, and a third thin film transistor, the first thin film transistor and the second thin film transistor each including a silicon semiconductor, and the third thin film transistor including an oxide semiconductor.

BRIEF DESCRIPTION OF THE DRAWINGS

The accompanying drawings, together with the specification, illustrate embodiments of the subject matter of the present disclosure, and, together with the description, serve to explain principles of embodiments of the subject matter of the present disclosure.

DETAILED DESCRIPTION

Figure 1:
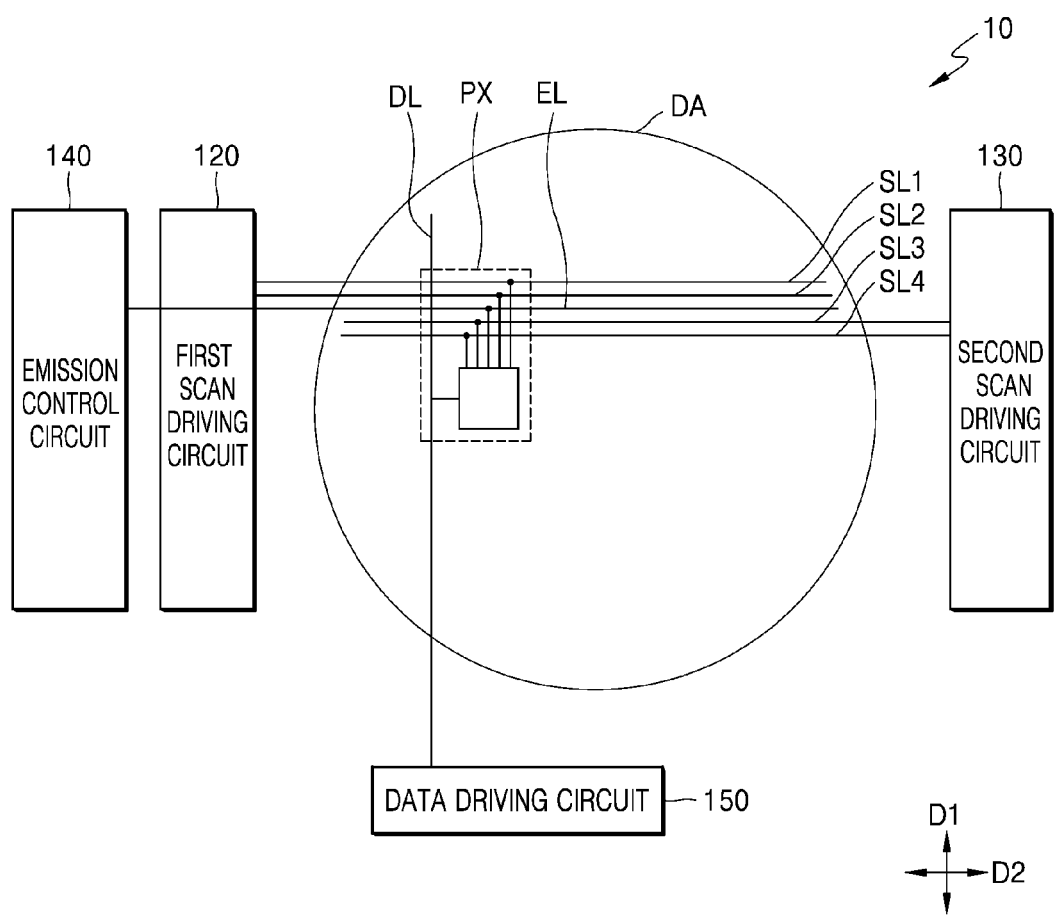
FIG. 1 is a configuration view of a display device according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises," "comprising," "includes," and "including" used herein specify the presence of stated features or components, but do not preclude the presence or addition of one or more other features or components.

It will be understood that when a layer, region, or component is referred to as being "on," another layer, region, or component, it may be directly or indirectly on the other layer, region, or component. For example, intervening layers, regions, or components may be present.

As used herein, the terms "use," "using," and "used" may be considered synonymous with the terms "utilize," "utilizing," and "utilized," respectively.

Sizes of elements in the drawings may be exaggerated for convenience of explanation. In other words, because sizes and thicknesses of components in the drawings are arbitrarily illustrated for convenience of explanation, the following embodiments are not limited thereto.

In the present specification, "A and/or B" means A or B, or A and B. In the present specification, "at least one of A and B" means A or B, or A and B.

As used herein, a wiring "extends in a first direction or a second direction" is intended to mean that the wire may not only extend in a straight line but also may extend in zigzags or a curve in the first direction or the second direction.

As used herein, the terms "in a plan view" means "an object is viewed from above" and the terms "in a cross-sectional view" means "a vertical cross section of an object is viewed from a side". As used herein, "overlapping" includes "overlapping in a plan view" and "overlapping in a cross-sectional view".

Hereinafter, embodiments of the present disclosure are described in more detail with reference to the accompanying drawings. In the drawings, like reference numerals are given to like or corresponding elements.

Figure 2:
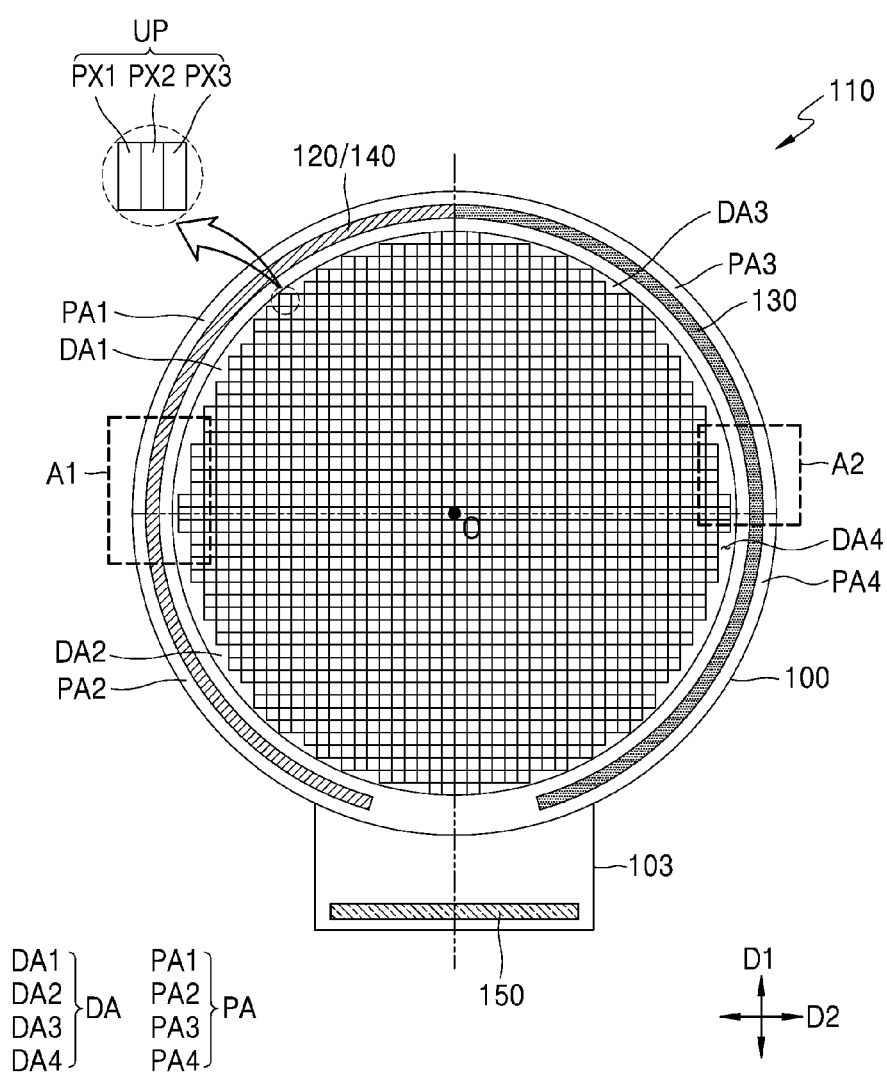
FIG. 2 is a view of a display panel of the display device shown in FIG. 1.

FIG. 1 is a configuration view of a display device 10 according to an embodiment. FIG. 2 is a view of a display panel 110 of the display device 10 shown in FIG. 1.

Referring to FIGS. 1 and 2, the display device 10, according to an embodiment, may include the display panel 110, and the display panel 110 may include a substrate 100. The substrate 100 may include a display area DA and a peripheral area PA, which is a non-display area, outside the display area DA.

The substrate 100 may have a non-quadrangular shape. The non-quadrangular shape may be, for example, a circle, an ellipse, a polygon in which a portion thereof is a circle, or a polygon other than a quadrangle.

The display area DA may have a shape corresponding to the shape of the substrate 100. FIG. 2 shows an example in which the substrate 100 has a circular shape and the display area DA has a circular shape corresponding to the shape of the substrate 100, but the present disclosure is not limited thereto. The display area DA may be divided into four areas around a center O of the display area DA. The display area DA may include a first display area DA1 on the upper left, a second display area DA2 on the lower left, a third display area DA3 on the upper right, and a fourth display area DA4 on the lower right. The peripheral area PA may surround the display area DA and have a shape corresponding to a shape of an edge of the display area DA. The peripheral area PA may include a first peripheral area PA1, which is a periphery of an edge of the first display area DA1, a second peripheral area PA2, which is a periphery of an edge of the second display area DA2, a third peripheral area PA3, which is a periphery of an edge of the third display area DA3, and a fourth peripheral area PA4, which is a periphery of an edge of the fourth display area DA4. The first peripheral area PA1 and the second peripheral area PA2 may be symmetrical to the third peripheral area PA3 and the fourth peripheral area PA4, respectively, with the display area DA therebetween. The first peripheral area PA1 and the third peripheral area PA3 may minimize or reduce a dead space, and the second peripheral area PA2 and the fourth peripheral area PA4 may minimize or reduce a dead space.

A plurality of pixels PX and signal lines may be located in the display area DA, and the signal lines may apply an electric signal to the plurality of pixels PX. The plurality of pixels PX may include a first pixel PX1, a second pixel PX2, and a third pixel PX3, the first pixel PX1 emitting light of a first color, the second pixel PX2 emitting light of a second color, and the third pixel PX3 emitting light of a third color. As shown in FIG. 2, unit pixels UP, including the first pixel PX1, the second pixel PX2, and the third pixel PX3, may be repeatedly arranged in a first direction D1 and a second direction D2 in the display area DA. The unit pixels UP may be arranged to correspond to the shape of the display area DA. For example, row and column arrangements of the unit pixels UP arranged along the edge of the display area DA may generate a step difference.

The signal lines may include a plurality of data lines DL, a plurality of first scan lines SL1, a plurality of second scan lines SL2, a plurality of third scan lines SL3, a plurality of fourth scan lines SL4, and a plurality of emission control lines EL, and the signal lines may apply an electric signal to each of the pixels PX. The plurality of data lines DL each may extend in the first direction D1. The plurality of first scan lines SL1 to fourth scan lines SL4 and the plurality of emission control lines EL each may extend in the second direction D2.

Each of the pixels PX may be connected to a corresponding first scan line SL1 among the plurality of first scan lines SL1, a corresponding second scan line SL2 among the plurality of second scan lines SL2, a corresponding third scan line SL3 among the plurality of third scan lines SL3, a corresponding fourth scan line SL4 among the plurality of fourth scan lines SL4, a corresponding emission control line EL among the plurality of emission control lines EL, and a corresponding data line DL among the plurality of data lines DL.

The peripheral area PA may be an area in which the pixels PX are not arranged and driving circuits may be located, the driving circuit supplying a signal for driving the pixels PX. The driving circuits may include a first scan driving circuit 120, a second scan driving circuit 130, an emission control circuit 140, and a data driving circuit 150. The first scan driving circuit 120 may be connected to the first scan lines SL1 and the second scan lines SL2, and may output a first scan signal GP1 (see FIG. 3) to the first scan lines SL1 and output a second scan signal GP2 (see FIG. 3) to the second scan lines SL2. The second scan driving circuit 130 may be connected to the third scan lines SL3 and the fourth scan lines SL4, and may output a third scan signal GN1 (see FIG. 3) to the third scan lines SL3 and output a fourth scan signal GN2 (see FIG. 3) to the fourth scan lines SL4. The emission control circuit 140 may be connected to the emission control lines EL and may output an emission control signal EM (see FIG. 3) to the emission control lines EL. The data driving circuit 150 may be connected to the data lines DL and may output a data signal DATA (see FIG. 3) to the data lines DL.

The first scan driving circuit 120, the second scan driving circuit 130, and the emission control circuit 140 may be arranged in the peripheral area PA along the edge of the display area DA, that is, for example, the periphery of the display area DA. For example, the first scan driving circuit 120 and the emission control circuit 140 may be arranged in the first peripheral area PA1 and the second peripheral area PA2. A plurality of sub-driving circuits SC included in the first scan driving circuit 120 and a plurality of sub-driving circuits SC included in the emission control circuit 140 may be arranged in a line in the first peripheral area PA1 and the second peripheral area PA2. The second scan driving circuit 130 may be arranged in the third peripheral area PA3 and the fourth peripheral area PA4. A plurality of sub-driving circuits SC included in the second scan driving circuit 130 may be arranged in a line in the third peripheral area PA3 and the fourth peripheral area PA4. Because the plurality of sub-driving circuits SC are arranged in a line in the first peripheral area PA1 to the fourth peripheral area PA4, a dead space may be reduced. In FIG. 2, peripheral areas facing each other with the display area DA therebetween may be symmetrical to each other. In another embodiment, the peripheral areas facing each other with the display area DA therebetween may not be symmetrical to each other. For example, a peripheral area in which an input sensing driver such as a touch driver is arranged may not be symmetrical to another peripheral area facing the peripheral area. A shape of a portion of the peripheral area may be different from a shape of another portion of the peripheral area depending on a location in which the input sensing driver is arranged.

The data driving circuit 150 may be arranged on a film 103 in a chip-on-film (COF) method, the film 103 being electrically connected to pads arranged in the peripheral area PA of the substrate 100. Although FIG. 2 shows the film 103 connected to a circular substrate 100, embodiments of the present disclosure are not limited thereto. For example, in another embodiment, a protrusion may extend and protrude from one side of the substrate 100, and the data driving circuit 150 may be arranged on the film 103 electrically connected to pads arranged on the protrusion. In one embodiment, the protrusion may be included in the peripheral area PA and may include a bent area. In another embodiment, the data driving circuit 150 may be directly arranged on a portion of the substrate 100 in a chip-on-glass (COG) or chip-on-plastic (COP) method, the portion of the substrate 100 extending and protruding from the substrate 100.

Figure 3:
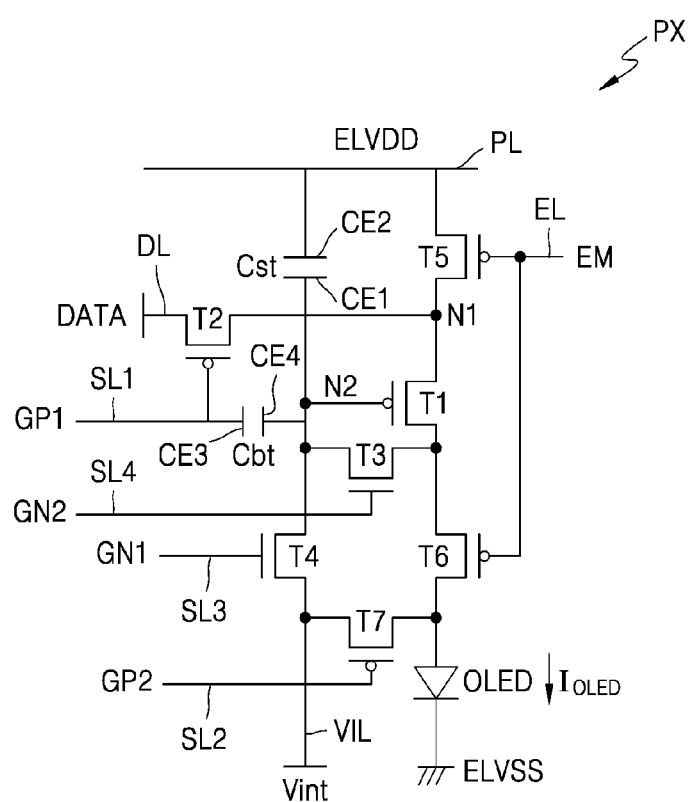
FIG. 3 is an equivalent circuit diagram of a pixel according to an embodiment.

FIG. 3 is an equivalent circuit diagram of a pixel PX according to an embodiment.

Referring to FIG. 3, in one embodiment, the pixel PX may include a plurality of first to seventh transistors T1, T2, T3, T4, T5, T6, and T7, a first capacitor Cst, a second capacitor Cbt, an organic light-emitting diode OLED as a display element, and signal lines SL1, SL2, SL3, SL4, EL, and DL, an initialization voltage line VIL, and a power voltage line PL connected thereto. In another embodiment, at least one of the signal lines SL1, SL2, SL3, SL4, EL, and DL, the initialization voltage line VIL, and/or the power voltage line PL may be shared by pixels that neighbor (e.g., are adjacent to) each other. The first to seventh transistors T1, T2, T3, T4, T5, T6, and T7 may be implemented as thin film transistors. FIG. 3 shows that, the third transistor T3 and the fourth transistor T4 among the first to seventh transistors T1, T2, T3, T4, T5, T6, and T7 may be n-channel metal oxide semiconductor (NMOS) field effect transistors, and the rest of the transistors may be p-channel metal oxide semiconductor (PMOS) field effect transistors.

The signal lines may include the plurality of data lines DL, the plurality of first scan lines SL1, the plurality of second scan lines SL2, the plurality of third scan lines SL3, the plurality of fourth scan lines SL4, and the plurality of emission control lines EL. The second scan line SL2 may be connected to the first scan line SL1 and may include the first scan signal GP1 and the second scan signal GP2.

The power voltage line PL may transfer a first power voltage ELVDD to the first transistor T1, and the initialization voltage line VIL may transfer an initialization voltage Vint to a pixel PX, the initialization voltage Vint initializing the first transistor T1 and the organic light-emitting diode OLED.

The first scan line SL1, the second scan line SL2, the third scan line SL3, the fourth scan line SL4, the emission control line EL, and the initialization voltage line VIL may extend in the second direction D2 and be apart from each other on each row. The data line DL and the power voltage line PL may extend in the first direction D1 and be apart from each other on each column.

The first transistor T1 may be connected to the power voltage line PL through the fifth transistor T5 and electrically connected to the organic light-emitting diode OLED through the sixth transistor T6. The first transistor T1 may serve as a driving transistor, receive a data signal DATA, and supply a driving current IDLED to the organic light-emitting diode OLED according to a switching operation of the second transistor T2.

The second transistor T2 may be connected to the first scan line SL1 and the data line DL and may be connected to the power voltage line PL through the fifth transistor T5. The second transistor T2 may be turned on in response to a first scan signal GP1 transferred through the first scan line SL1 and may perform a switching operation of transferring a data signal DATA transferred through the data line DL to a node N1.

The third transistor T3 may be connected to the fourth scan line SL4 and may be connected to the organic light-emitting diode OLED through the sixth transistor T6. The third transistor T3 may be turned on in response to a fourth scan signal GN2 transferred through the fourth scan line SL4 and may diode-connect the first transistor T1.

The fourth transistor T4 may be connected to the third scan line SL3 and the initialization voltage line VIL, may be turned on or may turn on in response to a third scan signal GN1 transferred through the third scan line SL3, and may transfer the initialization voltage Vint from the initialization voltage line VIL to a gate electrode of the first transistor T1, thereby initializing a voltage of the gate electrode of the first transistor T1.

The fifth transistor T5 and the sixth transistor T6 may be connected to the emission control line EL, may concurrently (e.g., simultaneously) turn on in response to an emission control signal EM transferred through the emission control line EL, and may constitute a current path such that the driving current IDLED flows through the organic light-emitting diode OLED from the power voltage line PL.

The seventh transistor T7 may be connected to the second scan line SL2 and the initialization voltage line VIL, may be turned on or may turn on in response to a second scan signal GP2 transferred through the second scan line SL2, and may transfer the initialization voltage Vint from the initialization voltage line VIL to the organic light-emitting diode OLED, thereby initializing the organic light-emitting diode OLED. In some embodiments, the seventh transistor T7 may be omitted.

The first capacitor Cst may include a first electrode CE1 and a second electrode CE2. The first electrode CE1 may be connected to the gate electrode of the first transistor T1, and the second electrode CE2 may be connected to the power voltage line PL. The first capacitor Cst may store and maintain a voltage corresponding to a difference between two opposite end portions of the power voltage line PL and the gate electrode of the first transistor T1, thereby maintaining a voltage applied to the gate electrode of the first transistor T1.

The second capacitor Cbt may include a third electrode CE3 and a fourth electrode CE4. The third electrode CE3 may be connected to the first scan line SL1 and the gate electrode of the second transistor T2. The fourth electrode CE4 may be connected to the gate electrode of the first transistor T1 and the first electrode CE1 of the first capacitor Cst. The second capacitor Cbt may be a boosting capacitor. In the case where a first scan signal GP1 of the first scan line SL1 is a voltage that turns off the second transistor T2, the second capacitor Cbt may raise a voltage of the node N2 and reduce a voltage (a black voltage) that displays black.

The organic light-emitting diode OLED may include a pixel electrode and an opposite electrode. The opposite electrode may receive a second power voltage ELVSS. The organic light-emitting diode OLED may display an image by receiving the driving current $I_{OLED}$ from the first transistor T1 and emitting light.

An operation of each pixel PX according to an embodiment is described below.

During an initialization period, when a third scan signal GN1 is supplied through the third scan line SL3, the fourth transistor T4 may be turned on in response to the third scan signal GN1, and the first transistor T1 may be initialized by the initialization voltage Vint supplied from the initialization voltage line VIL.

During a data programming period, when a first scan signal GP1, a second scan signal GP2, and a fourth scan signal GN2 are respectively supplied through the first scan line SL1, the second scan line SL2, and the fourth scan line SL4, the second transistor T2, the seventh transistor T7, and the third transistor T3 may be turned on in response to the first scan signal GP1, the second scan signal GP2, and the fourth scan signal GN2. In this case, the first transistor T1 may be diode-connected and forward-biased by the third transistor T3 that is turned on. Then, a compensation voltage may be applied to the gate electrode of the first transistor T1, the compensation voltage being a voltage compensated for by a threshold voltage Vth of the first transistor T1 from a data signal DATA supplied from the data line DL. The organic light-emitting diode OLED may be initialized by the initialization voltage Vint supplied from the initialization voltage line VIL through the seventh transistor T7 that is turned on. The first power voltage ELVDD and the compensation voltage may be applied to two opposite end portions of the first capacitor Cst, and an amount of charge that corresponds to a voltage difference between the two opposite end portions may be stored in the first capacitor Cst.

During an emission period, the fifth transistor T5 and the sixth transistor T6 may be turned on in response to an emission control signal EM supplied from the emission control line EL. A driving current $I_{OLED}$ may occur and be supplied to the organic light-emitting diode OLED through the sixth transistor T6, the driving current IDLED corresponding to a voltage difference between a voltage of the gate electrode of the first transistor T1 and the first power voltage ELVDD.

In the present embodiment, at least one of the plurality of transistors T1, T2, T3, T4, T5, T6, and T7 may include a semiconductor layer including an oxide, and the rest of the transistors may include a semiconductor layer including silicon. For example, the first transistor T1, which directly influences the brightness of the display device 10, may include a semiconductor layer including polycrystalline silicon having high reliability, and a display device 10 of a high resolution may be implemented through this configuration.

Because an oxide semiconductor has a high carrier mobility and a low leakage current, a voltage drop is not large even when a driving time is long. Because a color change of an image corresponding to a voltage drop is not large even during a low frequency driving, the display device may be driven at a low frequency. Because an oxide semiconductor may have a low leakage current, at least one of the third transistor T3 and the fourth transistor T4, which may be connected to the gate electrode of the first transistor T1, may include an oxide semiconductor. Thus, a leakage current that may flow to the gate electrode of the first transistor T1 may be reduced, and power consumption may be reduced (e.g., the leakage current and power consumption may both be concurrently reduced).

Figure 4A:
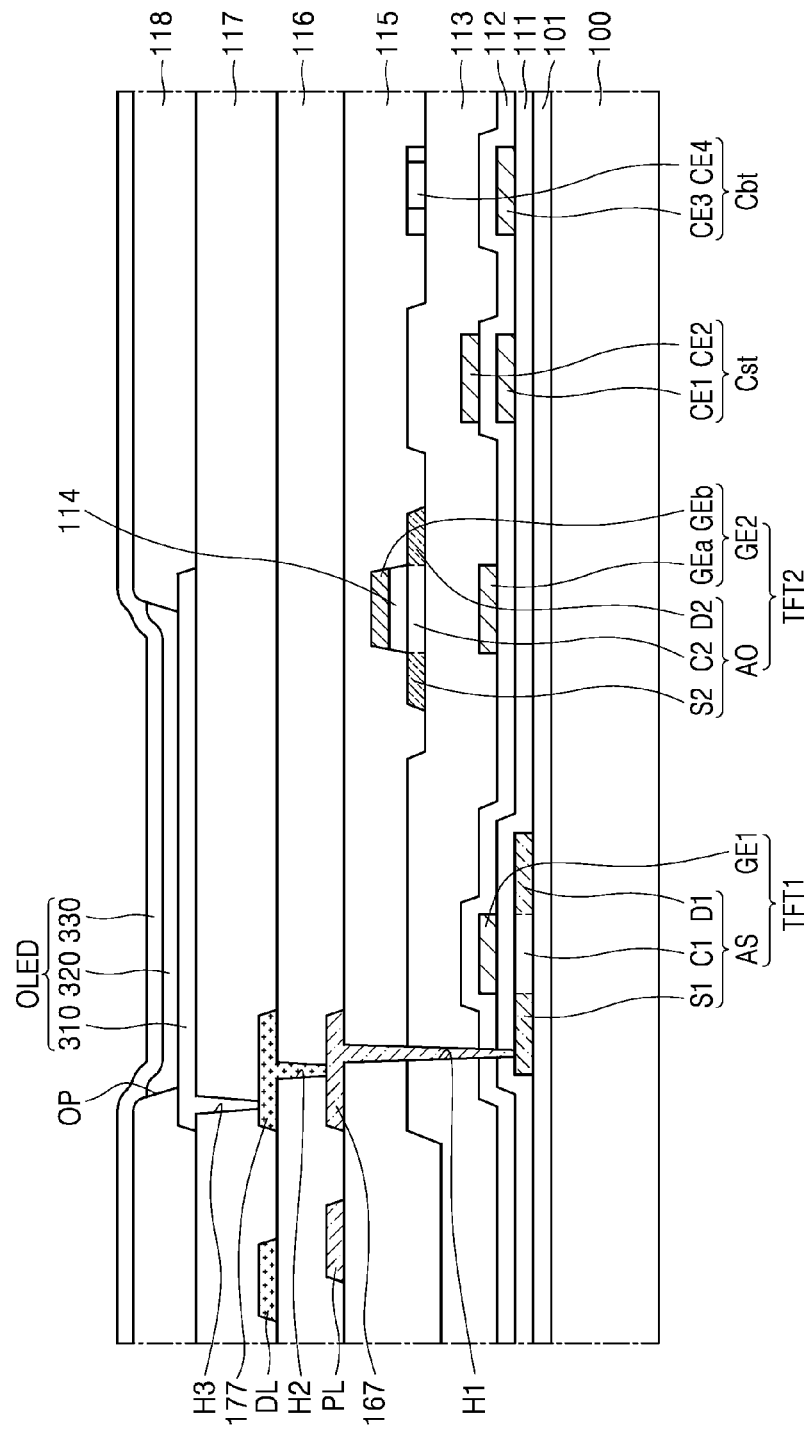
FIGS. 4A and 4B are cross-sectional views of a portion of a display device according to an embodiment.

FIG. 4A is a cross-sectional view of a portion of a display device 10 according to an embodiment.

Referring to FIG. 4A, the display device 10 according to an embodiment may include the substrate 100, a first thin film transistor TFT1 including a silicon semiconductor, a second thin film transistor TFT2 including an oxide semiconductor, a first capacitor Cst, and a second capacitor Cbt. The first thin film transistor TFT1 may be the first transistor T1, the second transistor T2, the fifth transistor T5, the sixth transistor T6, or the seventh transistor T7 of FIG. 3. The second thin film transistor TFT2 may be the third transistor T3 or the fourth transistor T4 of FIG. 3.

The substrate 100 may include a glass material, a ceramic material, a metal material, or a flexible or bendable material. In the case where the substrate 100 includes a flexible or bendable material, the substrate 100 may include a polymer resin such as polyethersulfone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), and cellulose acetate propionate (CAP). The substrate 100 may have a single-layered structure or a multi-layered structure. In the case where the substrate 100 has a multi-layered structure, the substrate 100 may further include an inorganic layer. In an embodiment, the substrate 100 may have a structure of an organic material/an inorganic material/an organic material (e.g., the substrate 100 may include an inorganic material layer between two organic material layers).

A buffer layer 101 may raise flatness of a top surface of the substrate 100 and include an oxide layer including silicon oxide ($SiO_x$) and/or a nitride layer including silicon nitride ($SiN_x$) or silicon oxynitride (SiON).

A barrier layer may further be between the substrate 100 and the buffer layer 101. The barrier layer may prevent, minimize or reduce the penetration of impurities from the substrate 100, etc. into a silicon semiconductor layer. The barrier layer may include an inorganic material and/or an organic material, the inorganic material including an oxide and a nitride. The barrier layer may have a single layered structure or a multi-layered structure of an inorganic material and an organic material (e.g., the multi-layered structure may include an inorganic material and an organic material).

A first semiconductor layer AS of the first thin film transistor TFT1, including the silicon semiconductor, may be on the buffer layer 101. The first semiconductor layer AS may include a source region S1, a drain region D1, and a channel region C1, the source region S1 and the drain region D1 being doped with impurities and having conductivity, and the channel region C1 being between the source region S1 and the drain region D1. The source region S1 and the drain region D1 may respectively correspond to a source electrode and a drain electrode of the first thin film transistor TFT1. The locations of the source region S1 and the drain region D1 may be exchanged.

A gate electrode GE1 of the first thin film transistor TFT1 may be over the first semiconductor layer AS. A first insulating layer 111 may be between the first semiconductor layer AS and the gate electrode GE1.

The first insulating layer 111 may include an inorganic material including an oxide and a nitride. For example, the first insulating layer 111 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The gate electrode GE1 of the first thin film transistor TFT1 may overlap the channel region C1 of the first semiconductor layer AS and include a single layer or a multi-layer including at least one of Mo, Cu, and Ti.

The first electrode CE1 of the first capacitor Cst and the third electrode CE3 of the second capacitor Cbt may be on the same layer that the gate electrode GE1 of the first thin film transistor TFT1 is on. The first electrode CE1 of the first capacitor Cst and the third electrode CE3 of the second capacitor Cbt may include substantially the same material as that of the gate electrode GE1 of the first thin film transistor TFT1. For example, the first electrode CE1 of the first capacitor Cst and the third electrode CE3 of the second capacitor Cbt may include a single layer or a multi-layer including at least one of Mo, Cu, and Ti.

A second insulating layer 112 may be on the gate electrode GE1 of the first thin film transistor TFT1, the first electrode CE1 of the first capacitor Cst, and the third electrode CE3 of the second capacitor Cbt.

The second insulating layer 112 may include an inorganic material including an oxide and a nitride. For example, the second insulating layer 112 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The second electrode CE2 of the first capacitor Cst may be on the second insulating layer 112 so as to overlap the first electrode CE1 of the first capacitor Cst. The second electrode CE2 may include a single layer or a multi-layer including at least one of Mo, Cu, and Ti.

A third insulating layer 113 may be on the second electrode CE2 of the first capacitor Cst. The third insulating layer 113 may include an inorganic material including an oxide and a nitride. For example, the third insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

Figure 4B:
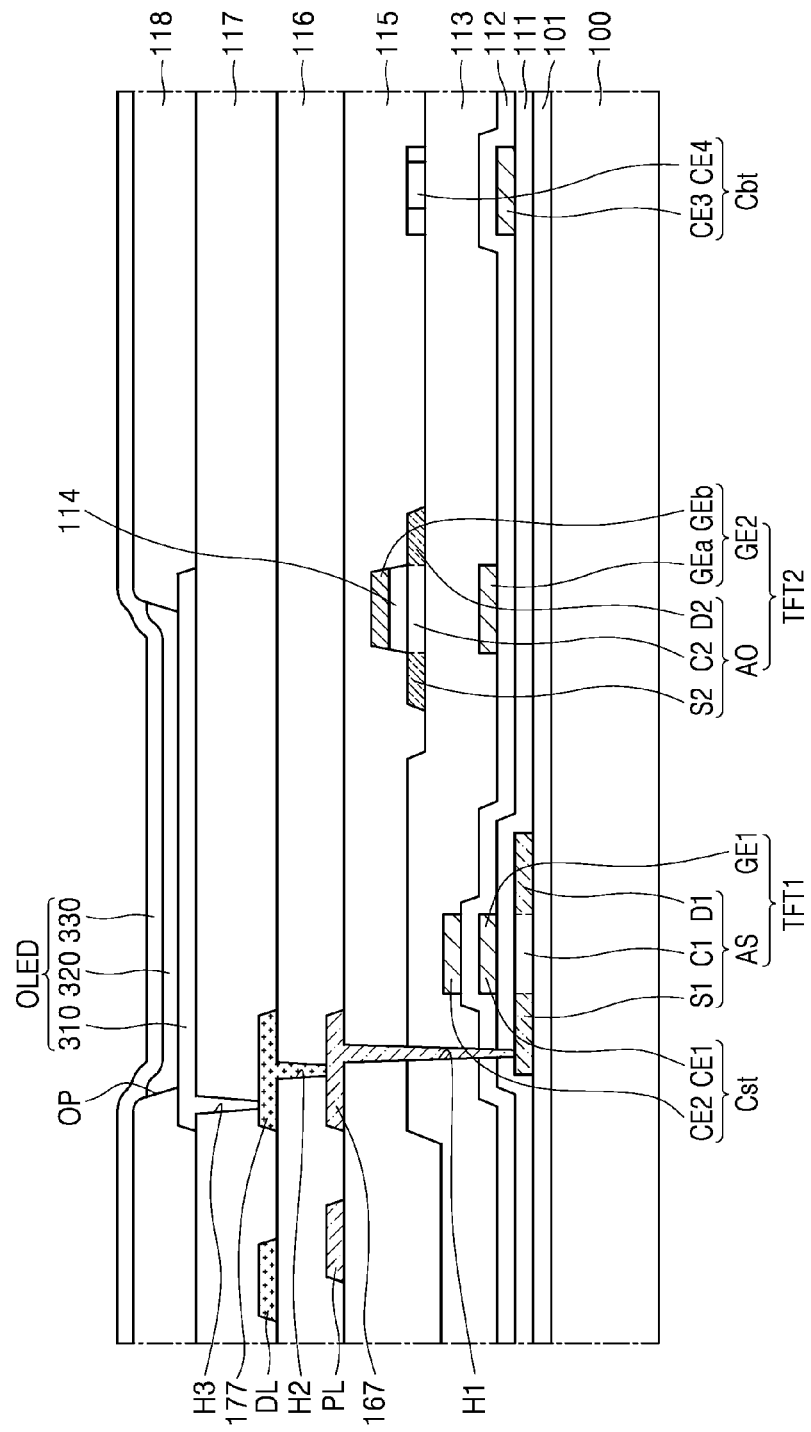

Although it is shown in FIG. 4A that the first capacitor Cst is apart from the first thin film transistor TFT1, the first capacitor Cst may overlap the first thin film transistor TFT1 in some embodiments, such as, for example, as shown in FIG. 4B. For example, the second electrode CE2 may be over the gate electrode GE1 of the first thin film transistor TFT1 such that the second electrode CE2 overlaps the gate electrode GE1. In this case, the gate electrode GE1 of the first thin film transistor TFT1 may perform a function of a gate electrode and also a function of the first electrode CE1 of the first capacitor Cst.

A second semiconductor layer AO of the second thin film transistor TFT2 may be on the third insulating layer 113, the second semiconductor layer AO including an oxide semiconductor. The second semiconductor layer AO may include a source region S2, a drain region D2, and a channel region C2. The source region S2 and the drain region D2 may have conductivity and be apart from each other, and the channel region C2 may be between the source region S2 and the drain region D2. The oxide semiconductor may include Zn oxide, In—Zn oxide, and Ga—In—Zn oxide as a Zn oxide-based material. For example, the second semiconductor layer AO may include an IGZO (In—Ga—Zn—O) semiconductor, an ITZO (In—Sn—Zn—O) semiconductor, or an IGTZO (In—Ga—Sn—Zn—O) semiconductor including ZnO containing a metal such as, for example, In, Ga, and Sn (e.g., the second semiconductor layer AO may include ZnO that contains any one or more of In, Ga, and Sn). The source region S2 and the drain region D2 of the second semiconductor layer AO may be formed by adjusting carrier concentration of an oxide semiconductor and making the oxide semiconductor conductive. For example, the source region S2 and the drain region D2 may be formed by performing a plasma process that uses a hydrogen (H)-based gas, a fluorine (F)-based gas, or a combination thereof on the oxide semiconductor to increase carrier concentration.

A first gate electrode GEa may be below the second semiconductor layer AO of the second thin film transistor TFT2, and a second gate electrode GEb may be over the second semiconductor layer AO of the second thin film transistor TFT2. For example, a gate electrode GE2 of the second thin film transistor TFT2 may have a dual gate electrode structure. The third insulating layer 113 may be between the first gate electrode GEa and the second semiconductor layer AO. The first gate electrode GEa of the second thin film transistor TFT2 may be on the same layer as the second electrode CE2 of the first capacitor Cst and may include substantially the same material as that of the second electrode CE2. The channel region C2 of the second semiconductor layer AO may overlap the first gate electrode GEa of the second thin film transistor TFT2.

A fourth insulating layer 114 may be between the second semiconductor layer AO of the second thin film transistor TFT2 and the second gate electrode GEb. The second gate electrode GEb may overlap the channel region C2 of the second semiconductor layer AO. The fourth insulating layer 114 may be formed during the same mask process as a mask process of the second gate electrode GEb. In this case, the fourth insulating layer 114 may be substantially the same shape as that of the second gate electrode GEb.

The fourth insulating layer 114 may include an inorganic material including an oxide and a nitride. For example, the fourth insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The second gate electrode GEb may include a single layer or a multi-layer including at least one of Mo, Cu, and Ti.

The fourth electrode CE4 of the second capacitor Cbt may be on the third insulating layer 113 so as to overlap the third electrode CE3. The fourth electrode CE4 of the second capacitor Cbt may include an oxide semiconductor. In an embodiment, the fourth electrode CE4 of the second capacitor Cbt may be a portion that extends from the second semiconductor layer AO of the second thin film transistor TFT2 and overlaps the third electrode CE3. The second insulating layer 112 and the third insulating layer 113 may be between the third electrode CE3 and the fourth electrode CE4.

A fifth insulating layer 115 may cover the second thin film transistor TFT2. The fifth insulating layer 115 may be on the second gate electrode GEb. The power voltage line PL and a first connection electrode 167 may be on the fifth insulating layer 115.

The fifth insulating layer 115 may include an inorganic material including an oxide and a nitride. For example, the fifth insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The power voltage line PL and the first connection electrode 167 may include a material having a high conductivity such as, for example, metal and a conductive oxide. For example, the power voltage line PL and the first connection electrode 167 may include a single layer or a multi-layer including at least one of Al, Cu, and Ti. In an embodiment, the power voltage line PL and the first connection electrode 167 may include a triple layer of Ti/Al/Ti in which titanium, aluminum, and titanium are sequentially arranged.

The first connection electrode 167 may be connected to the first semiconductor layer AS through a contact hole H1. The contact hole H1 may pass through the first insulating layer 111, the second insulating layer 112, the third insulating layer 113, and the fifth insulating layer 115 and expose a portion of the first semiconductor layer AS. A portion of the first connection electrode 167 may be inserted into the contact hole H1 and electrically connected to the first semiconductor layer AS.

A sixth insulating layer 116, which is a planarization layer, may be on the power voltage line PL and the first connection electrode 167. The sixth insulating layer 116 may include an organic material such as an acrylic, benzocyclobutene (BCB), polyimide, or hexamethyldisiloxane (HMDSO). In some embodiments, the sixth insulating layer 116 may include an inorganic material. The sixth insulating layer 116 may serve as a protective layer covering the first thin film transistor TFT1 and the second thin film transistor TFT2, and a top surface of the sixth insulating layer 116 may be flat. The sixth insulating layer 116 may include a single layer or a multi-layer.

A data line DL and a second connection electrode 177 may be on the sixth insulating layer 116. The data line DL may partially overlap the power voltage line PL. The second connection electrode 177 may be connected to the first connection electrode 167 through a contact hole H2 defined in the sixth insulating layer 116. The data line DL and the second connection electrode 177 may include a conductive material such as metal and a conductive oxide. For example, the data line DL and the second connection electrode 177 may include a single layer or a multi-layer including at least one of Al, Cu, and Ti. A seventh insulating layer 117 may be on the data line DL and the second connection electrode 177.

An organic light-emitting diode OLED may be on the seventh insulating layer 117. The organic light-emitting diode OLED may include a pixel electrode 310, an opposite electrode 330, and an intermediate layer 320, the intermediate layer 320 being between the pixel electrode 310 and the opposite electrode 330 and including an emission layer.

The pixel electrode 310 may be connected to the second connection electrode 177 through a contact hole H3 defined in the seventh insulating layer 117, and connected to the first thin film transistor TFT1 through the second connection electrode 177 and the first connection electrode 167.

An eighth insulating layer 118 may be a pixel-defining layer and may be on the seventh insulating layer 117. The eighth insulating layer 118 may define a pixel by including an opening OP that corresponds to each pixel. For example, the opening OP may expose a portion of the pixel electrode 310. Also, the eighth insulating layer 118 may reduce (e.g., prevent) the occurrence of an arc, etc. from occurring at edges of the pixel electrode 310 by increasing a distance between the edges of the pixel electrode 310 and the opposite electrode 330 over the pixel electrode 310. The eighth insulating layer 118 may include an organic material including, for example, polyimide and HMDSO.

The pixel electrode 310 may be on the seventh insulating layer 117 and may include a conductive oxide including indium tin oxide (ITO), zinc oxide (IZO), zinc oxide (ZnO), indium oxide ($In_2O_3$), indium gallium oxide (IGO), and aluminum zinc oxide (AZO). In another embodiment, the pixel electrode 310 may include a reflective layer including Ag, Mg, Al, Pt, Pd, Au, Ni, Nd, Ir, Cr, or a compound thereof. In another embodiment, the pixel electrode 310 may further include a layer including ITO, IZO, ZnO, or $In_2O_3$ either on or under the reflective layer.

The intermediate layer 320 of the organic light-emitting diode OLED may include an emission layer. The emission layer may include a polymer organic material or a low molecular weight organic material that emits light of a predetermined or set color. The emission layer may be a red emission layer, a green emission layer, or a blue emission layer. In some embodiments, the emission layer may have a multi-layered structure in which a red emission layer, a green emission layer, and a blue emission layer are stacked so as to emit white light. In some embodiments, the emission layer may have a single-layered structure including a red emission material, a green emission material, or a blue emission material. In an embodiment, the intermediate layer 320 may include a first functional layer under the emission layer and/or a second functional layer on the emission layer. The first functional layer and/or the second functional layer may include a layer that is one body over a plurality of pixel electrodes 310 or include a layer patterned so as to correspond to each of the plurality of pixel electrodes 310.

The first functional layer may include a single layer or a multi-layer. For example, in the case where the first functional layer includes a polymer material, the first functional layer may be a hole transport layer (HTL) that has a single-layered structure. The first functional layer may include poly-(3,4)-ethylene-dihydroxy thiophene (PEDOT) or polyaniline (PANI). In the case where the first functional layer includes a low molecular weight material, the first functional layer may include a hole injection layer (HIL) and a hole transport layer (HTL).

In some embodiments, the second functional layer may be omitted. For example, in the case where the first functional layer and the emission layer include a polymer material, the second functional layer may make a characteristic of the organic light-emitting diode OLED excellent. The second functional layer may include a single layer or a multi-layer. The second functional layer may include an electron transport layer (ETL) and/or an electron injection layer (EIL).

The opposite electrode 330 may face the pixel electrode 310 with the intermediate layer 320 therebetween. The opposite electrode 330 may include a conductive material having a low work function. For example, the opposite electrode 330 may include a (semi) transparent layer including Ag, Mg, Al, Pt, Pd, Au, Ni, Nd, Ir, Cr, Li, Ca, or an alloy thereof. In some embodiments, the opposite electrode 330 may further include a layer including ITO, IZO, ZnO, or $In_2O_3$ on or under the (semi) transparent layer including the above-described material(s). The opposite electrode 330 may be on the intermediate layer 320 and the eighth insulating layer 118. The opposite electrode 330 may be one body over the plurality of organic light-emitting diodes OLED in the display area DA and may be a common electrode facing the plurality of pixel electrodes 310.

A thin-film encapsulation layer or an encapsulation substrate may be arranged on the organic light-emitting diode OLED to cover and protect the organic light-emitting diode OLED. The thin-film encapsulation layer may cover the display area DA and extend to the outside of the display area DA. The thin-film encapsulation layer may include an inorganic encapsulation layer including at least one inorganic material and an organic encapsulation layer including at least one organic material. In an embodiment, the thin-film encapsulation layer may have a structure in which a first inorganic encapsulation layer, an organic encapsulation layer, and a second inorganic encapsulation layer are stacked. The encapsulation substrate may face the substrate 100 and may be bonded to the substrate 100 by a sealing member such as, for example, a sealant and/or frit.

Also, a spacer may be further on the eighth insulating layer 118, the spacer reducing (e.g., preventing) mask chopping. Various functional layers may be on the thin-film encapsulation layer. The various functional layers may include a polarization layer, a black matrix, color filters for reducing external light reflection, and/or a touchscreen including a touch electrode, etc.

Figure 5:
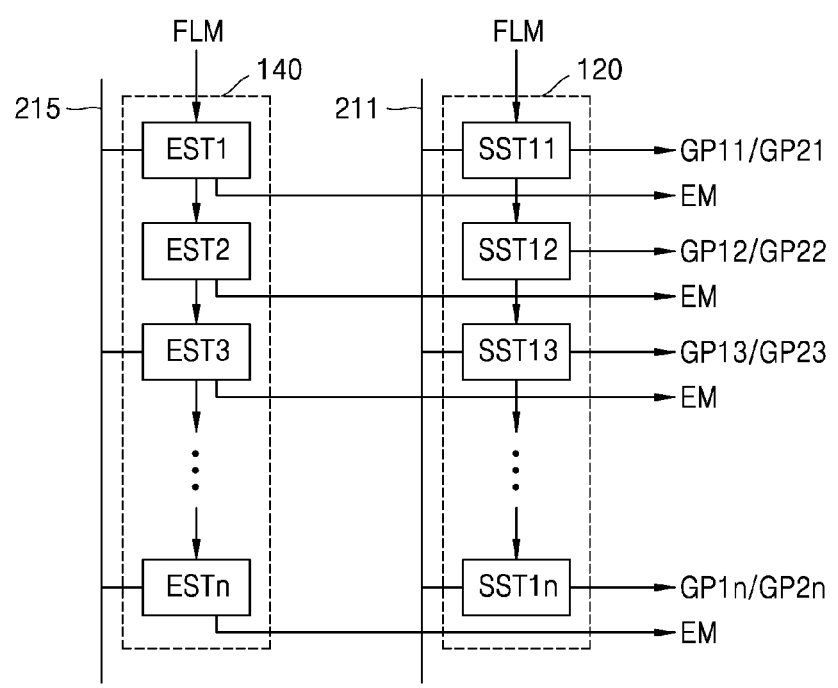
FIG. 5 is a view of a first scan driving circuit and an emission control circuit according to an embodiment.
Figure 6:
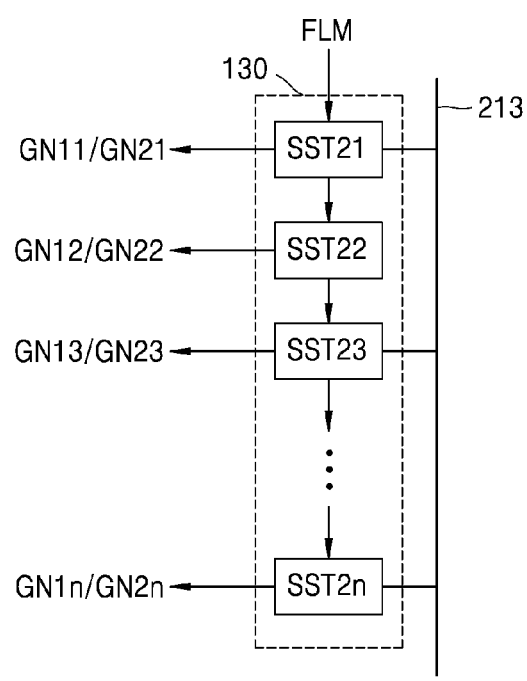
FIG. 6 is a view of a second scan driving circuit according to an embodiment.

FIG. 5 is a view of the first scan driving circuit 120 and the emission control circuit 140 according to an embodiment, and FIG. 6 is a view of the second scan driving circuit 130 according to an embodiment.

Referring to FIGS. 5 and 6, the first scan driving circuit 120, the second scan driving circuit 130, and the emission control circuit 140 each may include a shift register including a plurality of stages.

The first scan driving circuit 120 may include a plurality of stages SST11 to SST1n that are subordinately connected. The plurality of stages SST11 to SST1n may output first scan signals GP11 to GP1n to a first scan line SL1 corresponding thereto, and output second scan signals GP21 to GP2n to a second scan line SL2 corresponding thereto. A first stage SST11 among the plurality of stages SST11 to SST1n may output a first scan signal GP11 and a second scan signal GP21 in response to a start signal FLM, and the rest of the stages SST12 to SST1n except the first stage SST11 may receive a carry signal, as a start signal, from the previous stages SST11 to SST1n-1. A carry signal may be a first scan signal or a second scan signal output from the previous stage. Each of the plurality of stages SST11 to SST1n may output a first scan signal and a second scan signal according to a driving timing. In an embodiment, a first scan signal and a second scan signal may be respectively output from different output terminals of each stage and output to the first scan line SL1 and the second scan line SL2. In another embodiment, a first scan signal and a second scan signal may be output, as one scan signal, from one output terminal of each stage and divided and output to the first scan line SL1 and the second scan line SL2. The stages SST11 to SST1n may be respectively connected to a plurality of input lines 211 outside the stages SST11 to SST1n. The plurality of input lines 211 may include a plurality of voltage lines and a plurality of clock lines. Although FIG. 5 shows only one input line 211, for convenience of illustration, embodiments of the present disclosure are not limited thereto.

The second scan driving circuit 130 may include a plurality of stages SST21 to SST2n that are subordinately connected. The plurality of stages SST21 to SST2n may output third scan signals GN11 to GN1n to a third scan line SL3 corresponding thereto, and output fourth scan signals GN21 to GN2n to a fourth scan line SL4 corresponding thereto. A first stage SST21 among the plurality of stages SST21 to SST2n may output a third scan signal GN11 and a fourth scan signal GN21 in response to a start signal FLM, and the rest of the stages SST22 to SST2n except the first stage SST21 may receive a carry signal, as a start signal, from the previous stages SST21 to SST2n-1. A carry signal may be a third scan signal or a fourth scan signal output from the previous stage. Each of the plurality of stages SST21 to SST2n may output a third scan signal and a fourth scan signal according to a driving timing. In an embodiment, a third scan signal and a fourth scan signal may be respectively output from different output terminals of each stage at different timings and output to the third scan line SL3 and the fourth scan line SL4. The stages SST21 to SST2n may be respectively connected to a plurality of input lines 213 outside the stages SST21 to SST2n. The plurality of input lines 213 may include a plurality of voltage lines and a plurality of clock lines. Although FIG. 6 shows only one input line 213, for convenience of illustration, embodiments of the present disclosure are not limited thereto.

The emission control circuit 140 may include a plurality of stages EST1 to ESTn that are subordinately connected. The plurality of stages EST1 to ESTn may output an emission control signal EM to an emission control line EL corresponding thereto. A first stage EST1 among the plurality of stages EST1 to ESTn may output an emission control signal EM in response to a start signal FLM, and the rest of the stages EST2 to ESTn except the first stage EST1 may receive a carry signal, as a start signal, from the previous stages EST1 to ESTn-1. A carry signal may be an emission control signal EM output from the previous stage. Each of the stages EST1 to ESTn may be connected to a plurality of input lines 215 outside the stages EST1 to ESTn. The plurality of input lines 215 may include a plurality of voltage lines and a plurality of clock lines. Although FIG. 5 shows only one input line 215, for convenience of illustration, embodiments of the present disclosure are not limited thereto.

Figure 7:
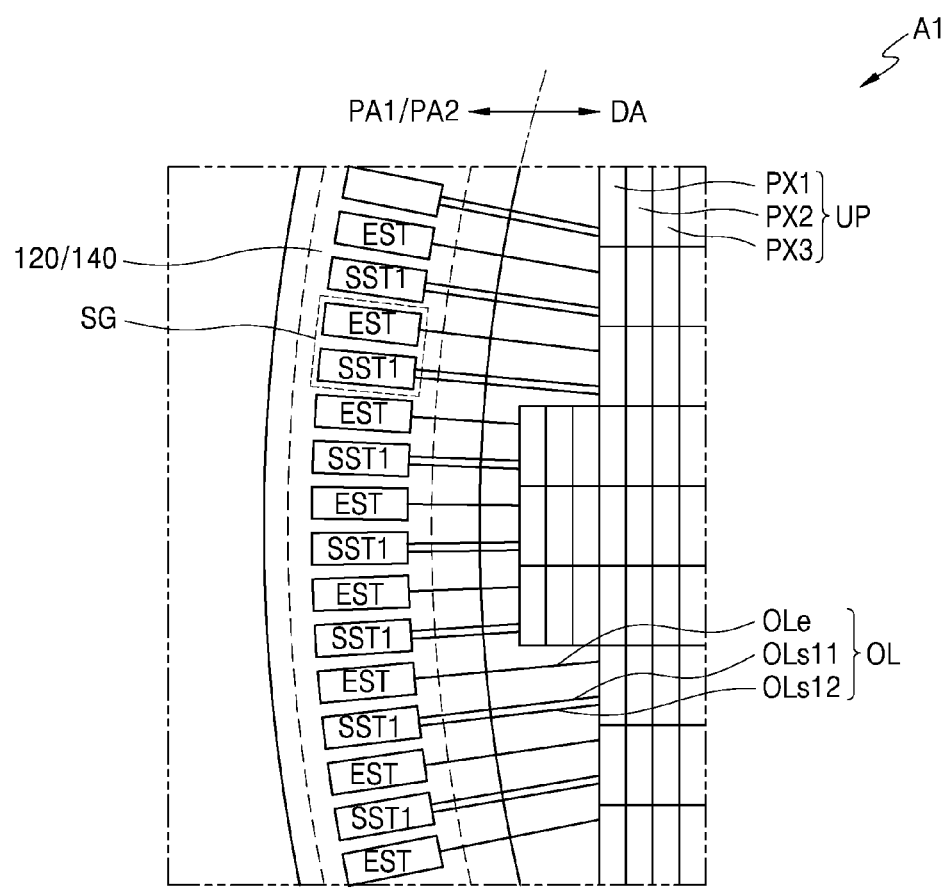
FIG. 7 is a plan view of an example of a region A1 of FIG. 2.
Figure 8:
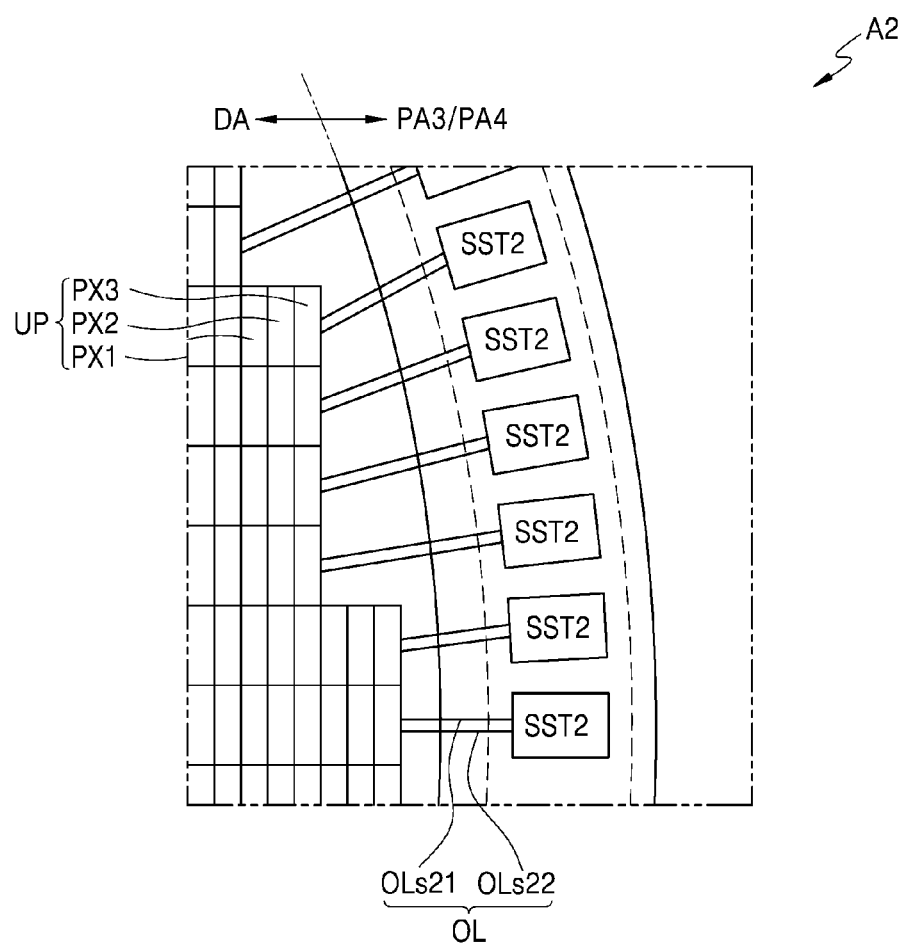
FIG. 8 is a plan view of an example of a region A2 of FIG. 2.
Figure 9:
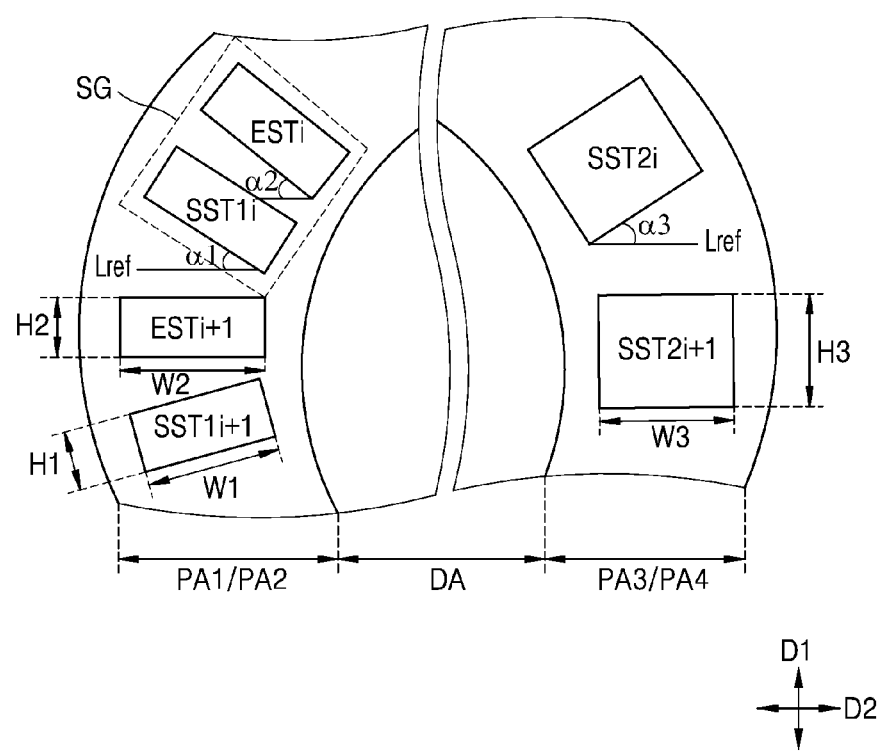
FIG. 9 is a view illustrating a size of driving circuits according to an embodiment.

FIG. 7 is a plan view of an example of a region A1 of FIG. 2, and FIG. 8 is a plan view of an example of a region A2 of FIG. 2. FIG. 9 is a view illustrating a size of driving circuits according to an embodiment.

Referring to FIG. 7, the first scan driving circuit 120 and the emission control circuit 140 may be arranged in a mixture in the first peripheral area PA1 and the second peripheral area PA2. For example, different driving circuits may be arranged in a line in the peripheral area PA. A stage SST1 of the first scan driving circuit 120 and a stage EST of the emission control circuit 140 may be alternately arranged in the first peripheral area PA1 and the second peripheral area PA2. A pair (referred to as a stage group SG) of a stage SST1 of the first scan driving circuit 120 and a stage EST of the emission control circuit 140 may be arranged in a line to correspond to one row. For example, as shown in FIG. 9, a pair of an i-th stage SST1i of the first scan driving circuit 120 and an i-th stage ESTi of the emission control circuit 140 that corresponds to an i-th row may be arranged adjacent in a line along the edge (e.g., along the periphery) of the display area DA. A pair of a (i+1)-th stage SST1i+1 of the first scan driving circuit 120 and a (i+1)-th stage ESTi+1 of the emission control circuit 140 that corresponds to a (i+1)-th row may be arranged adjacent in a line along the edge (e.g., along the periphery) of the display area DA. Because the driving circuits performing different functions are distributed in a line, a width of the peripheral area PA may be reduced.

Each of the stages SST11 to SST1n of the first scan driving circuit 120 may be connected to a first output line OLs11 and a second output line OLs12. The first output line OLs11 and the second output line OLs12 may be respectively connected to a first scan line SL1 and a second scan line SL2 of pixels PX on a corresponding row. A first scan signal GP1 and a second scan signal GP2 output from each of the stages SST11 to SST1n of the first scan driving circuit 120 may be applied to pixels PX on a corresponding row through the first output line OLs11 and the second output line OLs12. Each of the stages EST1 to ESTn of the emission control circuit 140 may be connected to an output line OLe, and the output line OLe may be connected to an emission control line EL of pixels PX on a corresponding row. An emission control signal EM output from each of the stages EST1 to ESTn of the emission control circuit 140 may be applied to pixels PX on a corresponding row through a corresponding output line OLe.

Referring to FIG. 8, the second scan driving circuit 130 may be arranged in the third peripheral area PA3 and the fourth peripheral area PA4. Each of the stages SST21 to SST2n of the second scan driving circuit 130 may be arranged to correspond to one row. For example, as shown in FIG. 9, an i-th stage SST2i of the second scan driving circuit 130 corresponding to an i-th row, and a (i+1)-th stage SST2i+1 of the second scan driving circuit 130 corresponding to a (i+1)-th row may be arranged adjacent in a line along the edge (e.g., along the periphery) of the display area DA. Each of the stages SST21 to SST2n of the second scan driving circuit 130 may be connected to a first output line OLs21 and a second output line OLs22, and the first output line OLs21 and the second output line OLs22 may be connected to a third scan line SL3 and a fourth scan line SL4 of pixels PX on a corresponding row. A third scan signal GN1 and a fourth scan signal GN2 output from each of the stages SST21 to SST2n of the second scan driving circuit 130 may be applied to pixels PX on a corresponding row through the first output line OLs21 and the second output line OLs22.

Areas occupied by stages of different driving circuits may be different from each other. An area of one stage SST1 of the first scan driving circuit 120, an area of one stage SST2 of the second scan driving circuit 130, and an area of one stage EST of the emission control circuit 140 may be different from one another. For example, as shown in FIG. 9, areas in which one stage SST1 of the first scan driving circuit 120, one stage SST2 of the second scan driving circuit 130, and one stage EST of the emission control circuit 140 may be arranged in the peripheral area PA and may have an approximately quadrangular shape. Hereinafter, a size of an area in which each stage is arranged is defined as a size of each stage.

A length W1 of a long side of one stage SST1 of the first scan driving circuit 120, a length W2 of a long side of one stage EST of the emission control circuit 140, and a length W3 of a long side of one stage SST2 of the second scan driving circuit 130 may be the same (e.g., approximately the same) or different from one another. A length H1 of a short side of one stage SST1 of the first scan driving circuit 120, a length H2 of a short side of one stage EST of the emission control circuit 140, and a length H3 of a short side of one stage SST2 of the second scan driving circuit 130 may be the same (e.g., approximately the same) or different from one another. For example, in one embodiment, a length H1 of a short side of one stage SST1 of the first scan driving circuit 120 may be approximately the same as a length H2 of a short side of one stage EST of the emission control circuit 140. A length H3 of a short side of one stage SST2 of the second scan driving circuit 130 may be approximately the same as a sum of a length H1 of a short side of one stage SST1 of the first scan driving circuit 120 and a length H2 of a short side of one stage EST of the emission control circuit 140. In the present specification, "approximately the same" means that a difference of a length is in an error range set in advance, the error range being within about 5%.

In an embodiment where the number of driving circuits arranged on the left and right side of the display area DA are different from each other, the sizes of the stages of respective driving circuits may be substantially horizontally symmetrical to each other. For example, in embodiments where two different driving circuits, such as, for example, the first scan driving circuit 120 and the emission control circuit 140 are arranged to the left of the display area DA, and one driving circuit, such as, for example, the second scan driving circuit 130 is arranged to the right of the display area DA, a sum of a size of a stage SST1 of the first scan driving circuit 120 and a size of a stage EST of the emission control circuit 140 may be approximately the same as a size of a stage SST2 of the second scan driving circuit 130. Therefore, in some embodiments, a circuit design may reduce a dead space without making one of the left side and the right side of the peripheral area larger than the other. In some embodiments, the left and right locations of the first scan driving circuit 120 and the second scan driving circuit 130 may be changed. For example, the second scan driving circuit 130 and the emission control circuit 140 may be distributed in the left peripheral area of the display area DA, and the first scan driving circuit 120 may be arranged in the right peripheral area of the display area DA.

Stages of each of the driving circuits may be inclined at a predetermined or set angle along the shape of the display area DA in a plan view. For example, as shown in FIG. 9, the stage SST1 of the first scan driving circuit 120 may be inclined by a first angle α1 with respect to a reference line Lref. The stage EST of the emission control circuit 140 may be inclined by a second angle α2 with respect to the reference line Lref. The stage SST2 of the second scan driving circuit 130 may be inclined by a third angle α3 with respect to the reference line Lref. The reference line Lref may be a virtual line parallel to the second direction D2. The first to third angles α1, α2, and α3 may depend on a location of a stage. Each of the first to third angles α1, α2, and α3 may be in the range of greater than 0° and less than 90°.

Figure 10:
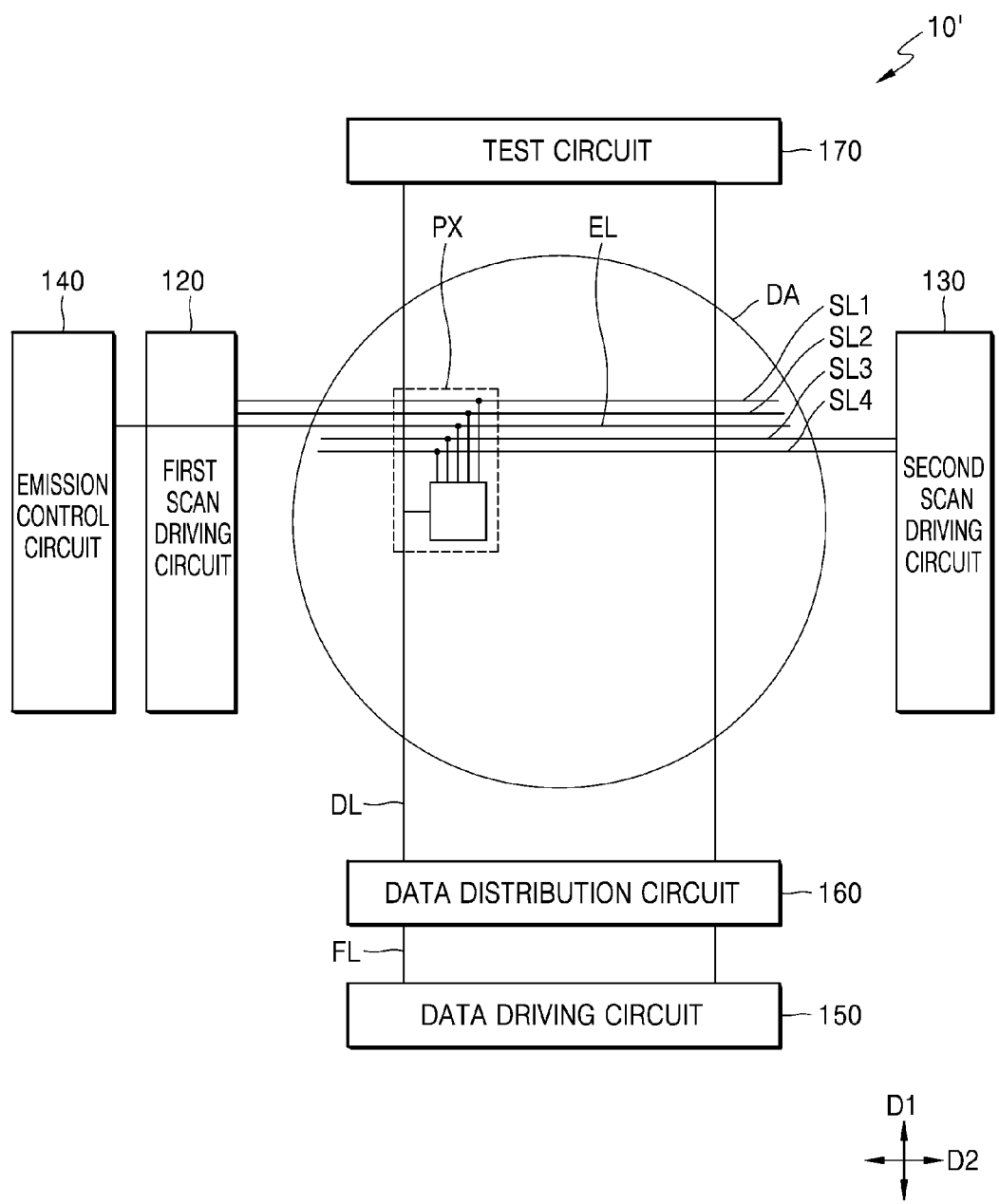
FIG. 10 is a configuration view of a display device according to another embodiment.
Figure 11:
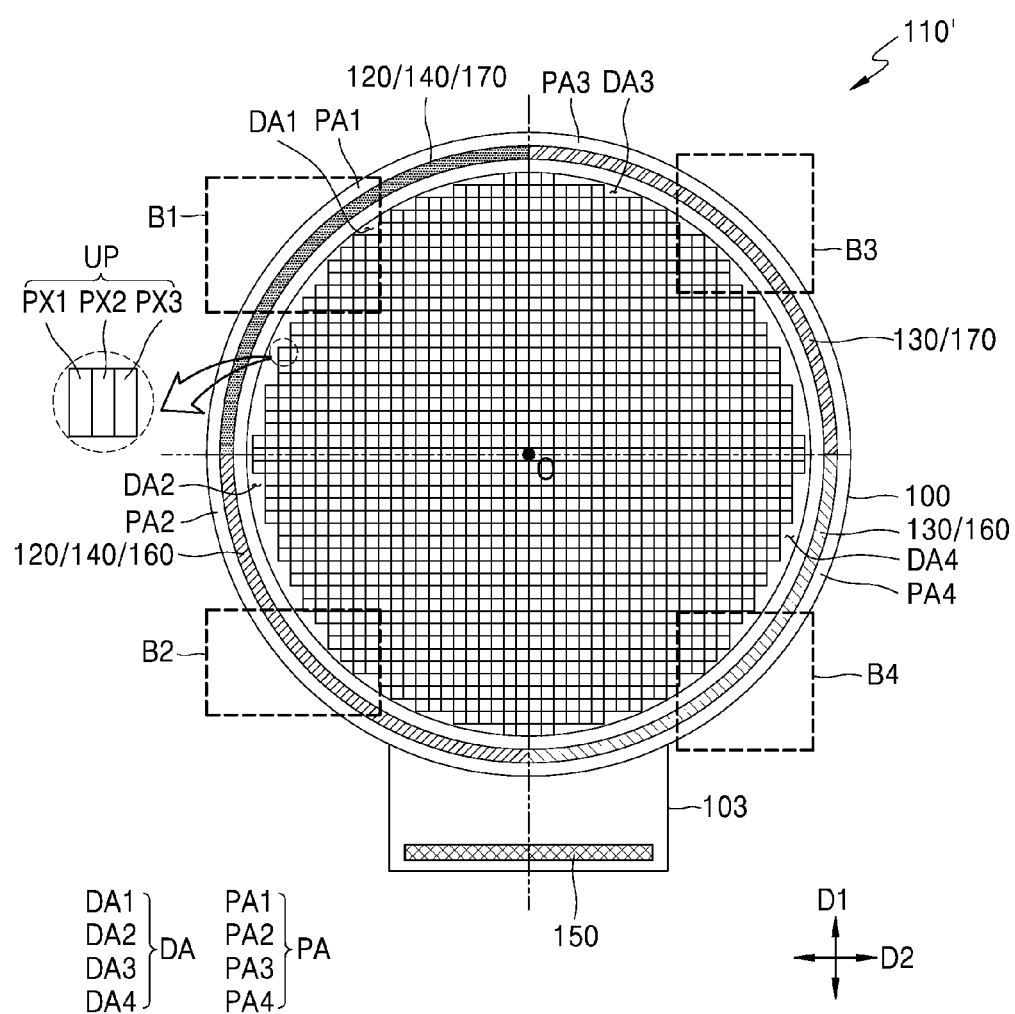
FIG. 11 is a view of a display panel of a display device shown in FIG. 10.
Figure 12A:
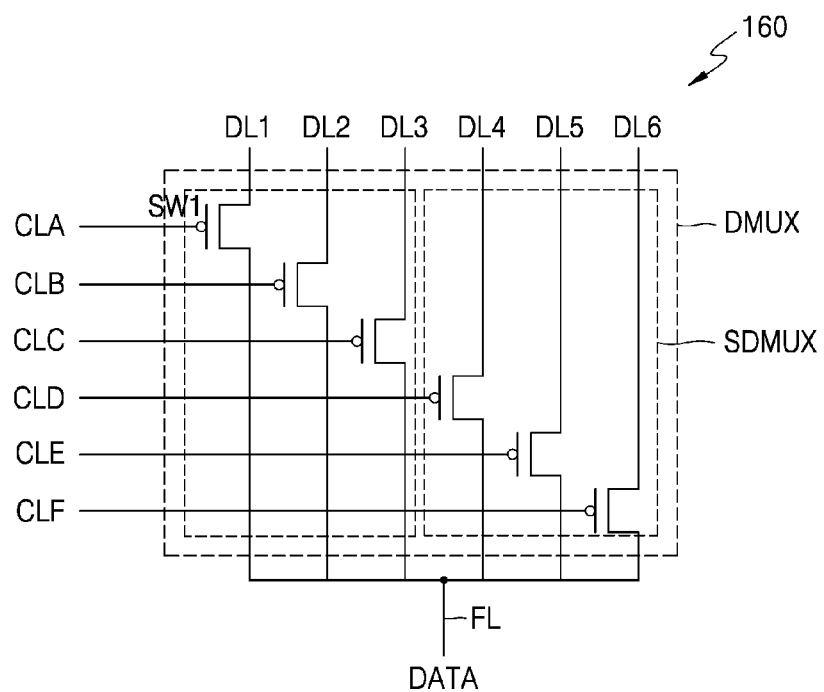
FIGS. 12A and 12B are views of a data distribution circuit according to an embodiment.
Figure 12B:
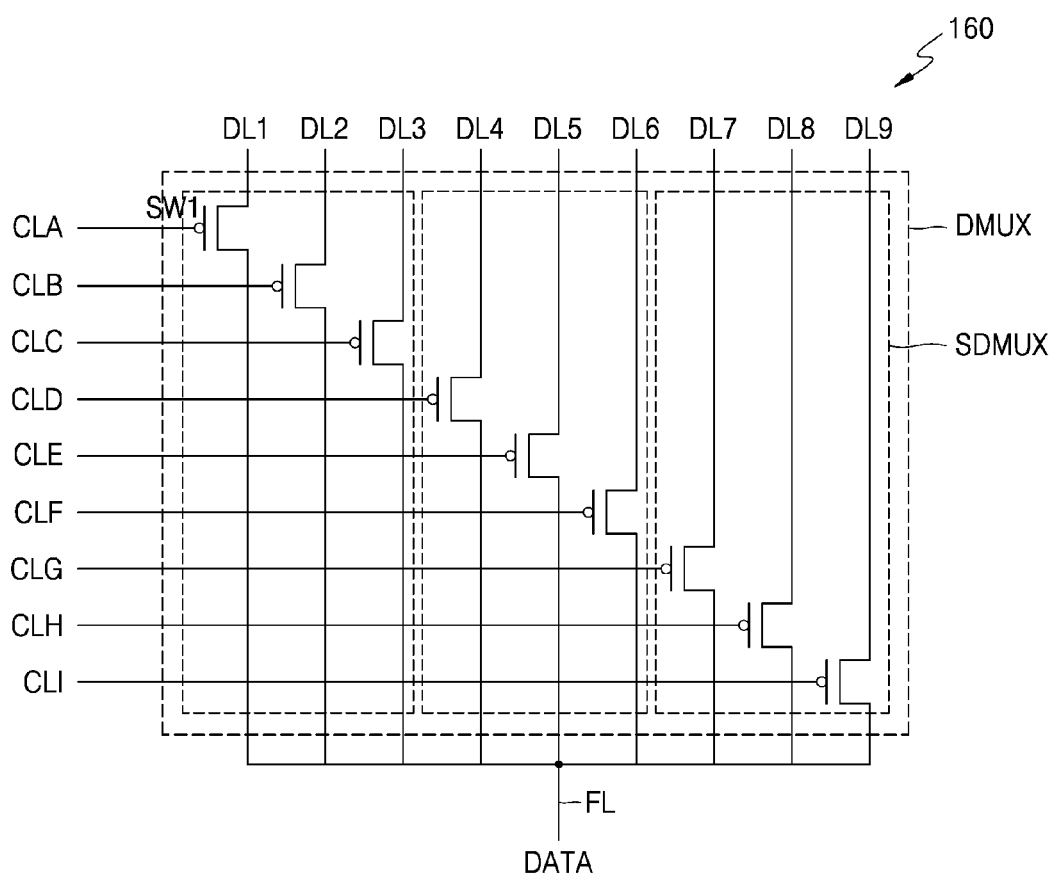
Figure 13:
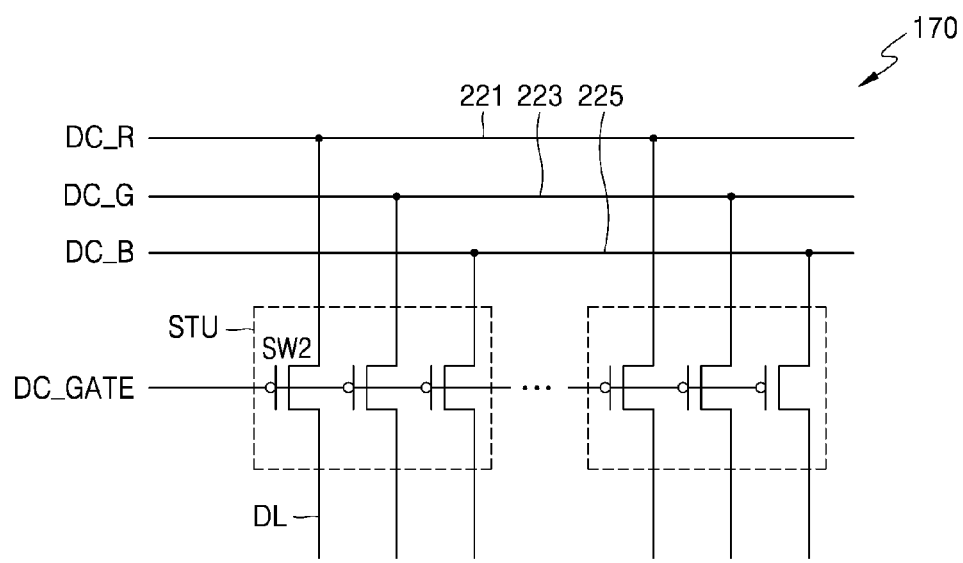
FIG. 13 is a view of a test circuit according to an embodiment.

FIG. 10 is a configuration view of a display device 10' according to another embodiment. FIG. 11 is a view of a display panel 110' of the display device 10' shown in FIG. 10. FIGS. 12A and 12B are views of a data distribution circuit 160 according to an embodiment, and FIG. 13 is a view of a test circuit 170 according to an embodiment.

Referring to FIGS. 10 and 11, the display device 10' according to an embodiment may include the display panel 110', and the display panel 110' may include the substrate 100. The substrate 100 may include the display area DA and the peripheral area PA, which is a non-display area outside the display area DA. The peripheral area PA may surround the display area DA and have a shape corresponding to a shape of the edge of the display area DA.

The display device 10' shown in FIG. 10 may further include the data distribution circuit 160 and the test circuit 170 compared to the display device 10 shown in FIG. 1. Hereinafter, a description of similar features included in the embodiment of FIG. 1 will not be repeated, and the features added thereto will be mainly described.

A plurality of stages SST11 to SST1n of the first scan driving circuit 120 may be distributed in the first peripheral area PA1 and the second peripheral area PA2. A plurality of stages SST21 to SST2n of the second scan driving circuit 130 may be distributed in the third peripheral area PA3 and the fourth peripheral area PA4. A plurality of stages EST1 to ESTn of the emission control circuit 140 may be distributed in the first peripheral area PA1 and the second peripheral area PA2.

The data distribution circuit 160 may be arranged between the data driving circuit 150 and the display area DA, may be connected to the data lines DL, and may transfer a data signal DATA from the data driving circuit 150 to the data lines DL. The data distribution circuit 160 may time-divide a data signal DATA and distribute divided data signals DATA to the plurality of data lines DL, the data signal DATA being applied through one output line FL of the data driving circuit 150.

As shown in FIG. 12A, the data distribution circuit 160 may include a plurality of demultiplexers DMUX. The number of demultiplexers DMUX may be the same as the number of output lines FL of the data driving circuit 150. Each demultiplexer DMUX may include a plurality of first switches SW1. The first switch SW1 may be a thin film transistor.

Each demultiplexer DMUX may divide a data signal DATA and supply the divided data signals DATA to six data lines DL1 to DL6, the data signal DATA being applied from one output line FL among the output lines FL of the data driving circuit 150. The first switches SW1 may be respectively turned on in response to corresponding control signals CLA to CLF and may apply data signals DATA to the data lines DL1 to DL6 corresponding thereto. In some embodiments, the number of output lines FL of the data driving circuit 150 may be reduced to ⅙ the number of data lines DL by using the demultiplexers DMUX. In some embodiments, the number of data lines DL connected to one demultiplexer DMUX may be changed. For example, as shown in FIG. 12B, each demultiplexer DMUX may divide a data signal DATA and supply divided data signals DATA to nine data lines DL1 to DL9, the data signal DATA being applied from one output line FL among the output lines FL of the data driving circuit 150. The first switches SW1 may be respectively turned on in response to corresponding control signals CLA to CLI and may apply the data signals DATA to the data lines DL1 to DL9 corresponding thereto. Each demultiplexer DMUX may be divided into a plurality of sub-demultiplexers SDMUX. As shown in FIGS. 12A and 12B, each demultiplexer DMUX may be divided into sub-demultiplexers SDMUX on a three-data line basis. Sub-demultiplexers SDMUX of the demultiplexers DMUX may be distributed in the second peripheral area PA2 and the fourth peripheral area PA4.

The test circuit 170 may be connected to the data lines DL and may apply a test signal to the data lines DL. As shown in FIG. 13, the test circuit 170 may include a plurality of sub-test circuits STU. Each sub-test circuit STU may include as many second switches SW2 as the number of pixels PX constituting a unit pixel UP. FIG. 13 shows an example in which the sub-test circuit STU includes three second switches SW2. The second switches SW2 may be connected to three data lines DL respectively connected to three pixels PX. The second switch SW2 may be a thin film transistor. Each of the second switches SW2 may be turned on in response to a control signal DC_GATE and may output a test signal DC_R, DC_G, or DC_B applied from a corresponding input line among input lines 221, 223, and 225 to a data line DL corresponding thereto. The display device 10' may recognize whether the pixels PX and the signal lines are defective by using the test circuit 170. The sub-test circuits STU of the test circuit 170 may be distributed in the first peripheral area PA1 and the third peripheral area PA3.

The data distribution circuit 160 may be connected to one end portion (e.g., terminal) of the plurality of data lines DL, and the test circuit 170 may be connected to another end portion (e.g., terminal) of the plurality of data lines DL.

FIGS. 14 to 17 are plan views of an example of regions B1 to B4 of FIG. 11. Hereinafter, a description of similar features included the embodiments of FIGS. 7 to 9 will not be repeated.

Figure 14:
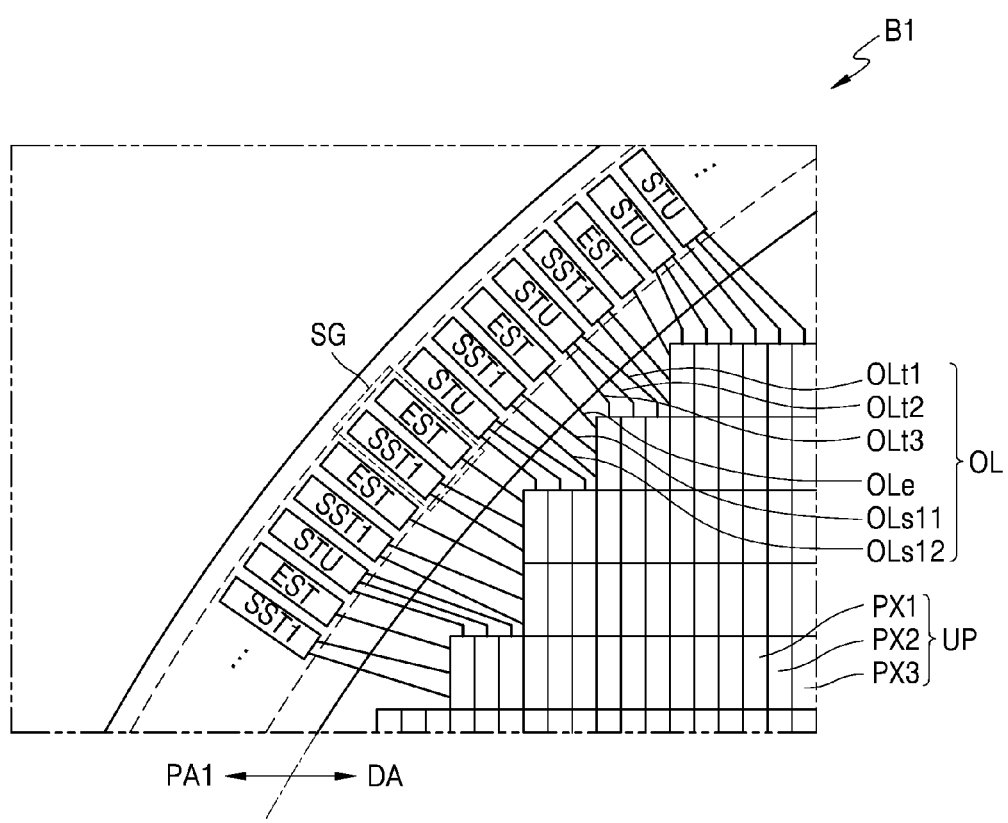
FIGS. 14 to 17 are plan views of an example of regions B1 to B4, respectively, of FIG. 11.

Referring to FIG. 14, the test circuit 170, the first scan driving circuit 120, and the emission control circuit 140 may be arranged in a mixture in the first peripheral area PA1. For example, the driving circuits that are different from one another may be arranged in a line in the first peripheral area PA1. Each stage group SG may be arranged in a line to correspond to one row in the first peripheral area PA1. Sub-test circuits STU connected to data lines DL arranged in the first display area DA1 and the second display area DA2 among sub-test circuits STU of the test circuit 170 may be distributed between the stage groups SG in the first peripheral area PA1.

At least one sub-test circuit STU may be arranged between the stage groups SG, or at least one stage group SG may be arranged between two sub-test circuits STU depending on the arrangement of the pixels. For example, one or two or more sub-test circuits STU may be successively arranged in a line between two stage groups SG in one region of the first peripheral area PA1. In some embodiments, one or two or more stage groups SG may be successively arranged in a line between two sub-test circuits STU in another region of the first peripheral area PA1.

Each of the sub-test circuits STU may be connected to as many output lines as the number of pixels constituting a unit pixel UP. For example, each of the sub-test circuits STU may be connected to three output lines including first to third output lines OLt1, OLt2, and OLt3. Each of the first to third output lines OLt1, OLt2, and OLt3 may be connected to a data line DL of a corresponding column. Each of three test signals DC_R, DC_G, and DC_B output from the sub-test circuit STU may be applied to pixels PX on a corresponding column through a corresponding output line among the first to third output lines OLt1, OLt2, and OLt3.

Figure 15:
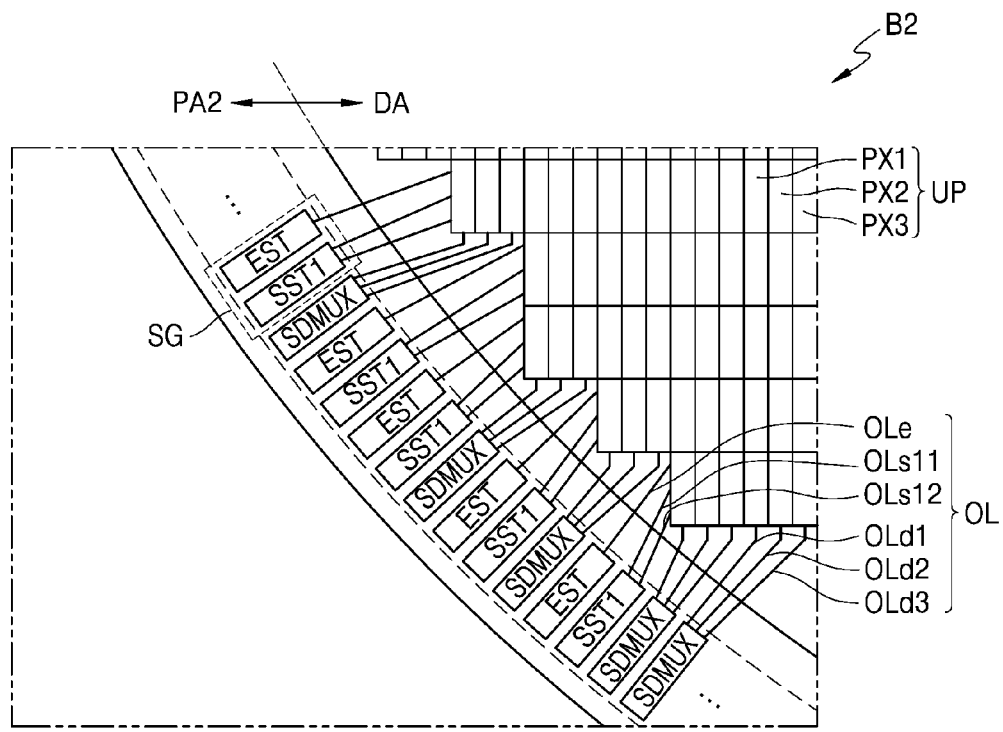

Referring to FIG. 15, the data distribution circuit 160, the first scan driving circuit 120, and the emission control circuit 140 may be arranged in a mixture in the second peripheral area PA2. For example, the driving circuits that are different from one another may be arranged in a line in the second peripheral area PA2. Each of the stage groups SG may be arranged in a line to correspond to one row in the second peripheral area PA2. Sub-demultiplexers SDMUX connected to the data lines DL arranged in the first display area DA1 and the second display area DA2 among sub-demultiplexers SDMUX of the data distribution circuit 160 may be distributed between the stage groups SG of the second peripheral area PA2.

At least one sub-demultiplexer SDMUX may be arranged between the stage groups SG, or at least one stage group SG may be arranged between two sub-demultiplexers SDMUX depending on the arrangement of the pixels. For example, one or two or more sub-demultiplexers SDMUX may be successively arranged in a line between the stage groups SG in one region of the second peripheral area PA2. In some embodiments, one or two or more stage groups SG may be successively arranged in a line between two sub-demultiplexers SDMUX in another region of the second peripheral area PA2.

Each of the sub-demultiplexers SDMUX may be connected to as many output lines as the number of pixels constituting a unit pixel UP. For example, each of the sub-demultiplexers SDMUX may be connected to three output lines including first to third output lines OLd1, OLd2, and OLd3. Each of the first to third output lines OLd1, OLd2, and OLd3 may be connected to a data line DL of a corresponding column. A data signal DATA output from the sub-demultiplexers DMUX may be applied to pixels PX on a corresponding column through a corresponding output line among the first to third output lines OLd1, OLd2, and OLd3.

Figure 16:
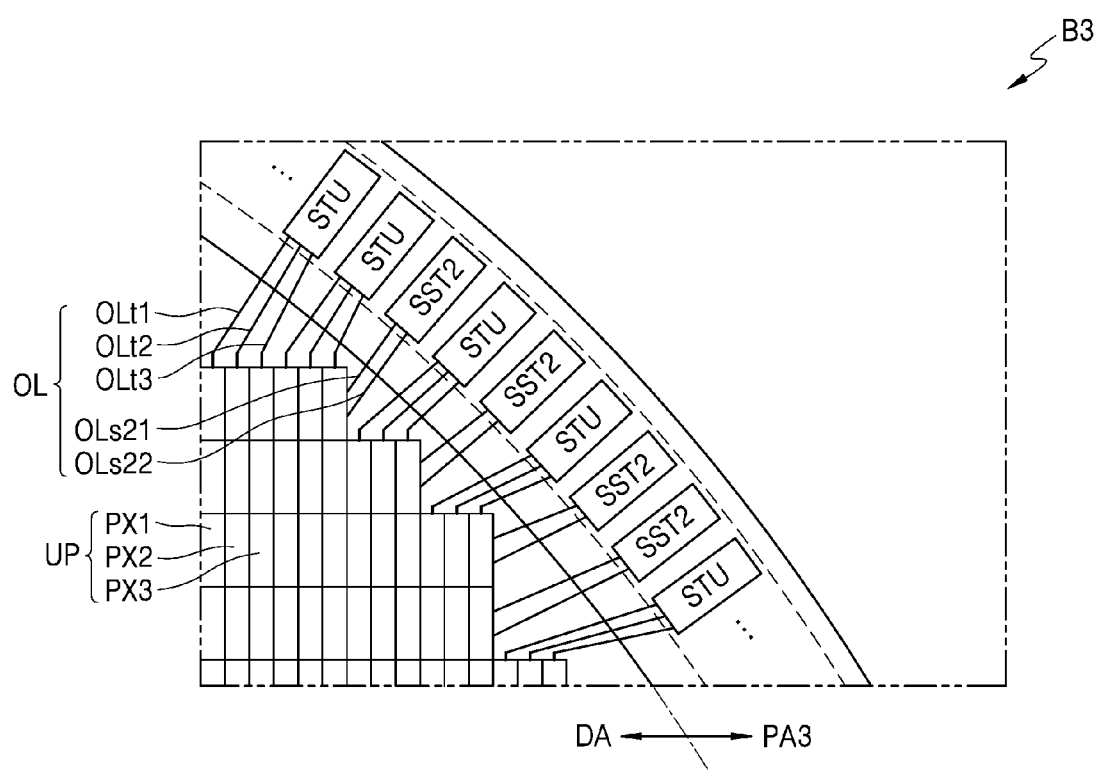

Referring to FIG. 16, the test circuit 170 and the second scan driving circuit 130 may be arranged in a mixture in the third peripheral area PA3. For example, the driving circuits that are different from each other may be arranged in a line in the third peripheral area PA3. Each of the stages SST2 of the second scan driving circuit 130 may be arranged in a line to correspond to one row in the third peripheral area PA3. Sub-test circuits STU connected to the data lines DL arranged in the third display area DA3 and the fourth display area DA4 among the sub-test circuits STU of the test circuit 170 may be distributed between the stages SST2 of the third peripheral area PA3.

At least one sub-test circuit STU may be arranged between the stages SST2, or at least one stage SST2 may be arranged between two sub-test circuits STU depending on the arrangement of the pixels. For example, one or two or more sub-test circuits STU may be successively arranged in a line between two stages SST2 in one region of the third peripheral area PA3. Further for example, one or two or more stages SST2 may be successively arranged in a line between two sub-test circuits STU in another region of the third peripheral area PA3.

Figure 17:
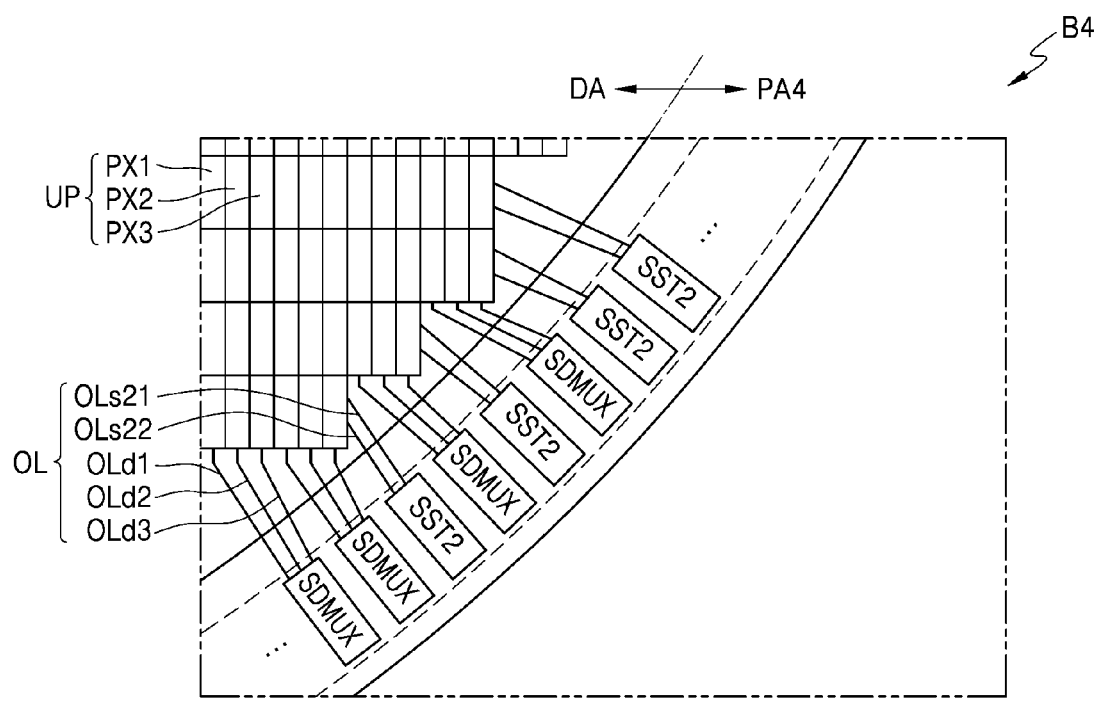

Referring to FIG. 17, the data distribution circuit 160 and the second scan driving circuit 130 may be arranged in a mixture in the fourth peripheral area PA4. For example, the driving circuits that are different from each other may be arranged in a line in the fourth peripheral area PA4. Each of the stages SST2 of the second scan driving circuit 130 may be arranged in a line to correspond to one row in the fourth peripheral area PA4. The sub-demultiplexers SDMUX connected to the data lines DL arranged in the third display area DA3 and the fourth display area DA4 among the sub-demultiplexers SDMUX of the data distribution circuit 160 may be distributed between the stages SST2 of the fourth peripheral area PA4.

At least one sub-demultiplexer SDMUX may be arranged between the stages SST2, or at least one stage SST2 may be arranged between two sub-demultiplexers SDMUX depending on the arrangement of the pixels. For example, one or two or more sub-demultiplexers SDMUX may be successively arranged in a line between the stages SST2 in one region of the fourth peripheral area PA4. In some embodiments, one or two or more stages SST2 may be successively arranged in a line between two sub-demultiplexers SDMUX in another region of the fourth peripheral area PA4.

In FIGS. 14 to 17, output lines arranged on the same layer may extend in a predetermined or set direction such that the output lines do not intersect each other.

Areas occupied by stages of different driving circuits may be different from each other. A region in which one of the sub-test circuits STU of the test circuit 170 and one of the sub-demultiplexers SDMUX of the data distribution circuit 160 are each arranged in the peripheral area PA may have an approximately quadrangular shape. An area of one of the sub-test circuits STU of the test circuit 170, an area of one of the sub-demultiplexers SDMUX of the data distribution circuit 160, an area of one stage SST1 of the first scan driving circuit 120, an area of one stage SST2 of the second scan driving circuit 130, and an area of one stage EST of the emission control circuit 140 may be the same (e.g., approximately the same) or different from one another.

In an embodiment of FIG. 11, as shown in FIG. 9, a length W1 of a long side of one stage SST1 of the first scan driving circuit 120, a length W2 of a long side of one stage EST of the emission control circuit 140, and a length W3 of a long side of one stage SST2 of the second scan driving circuit 130 may be approximately the same or different from one another. A length H1 of a short side of one stage SST1 of the first scan driving circuit 120, a length H2 of a short side of one stage EST of the emission control circuit 140, and a length H3 of a short side of one stage SST2 of the second scan driving circuit 130 may be the same (e.g., approximately the same) or different from one another. For example, in one embodiment, a length H1 of a short side of one stage SST1 of the first scan driving circuit 120 may be approximately the same as a length H2 of a short side of one stage EST of the emission control circuit 140. A length H3 of a short side of one stage SST2 of the second scan driving circuit 130 may be approximately the same as a sum of a length H1 of a short side of one stage SST1 of the first scan driving circuit 120 and a length H2 of a short side of one stage EST of the emission control circuit 140.

Figure 18:
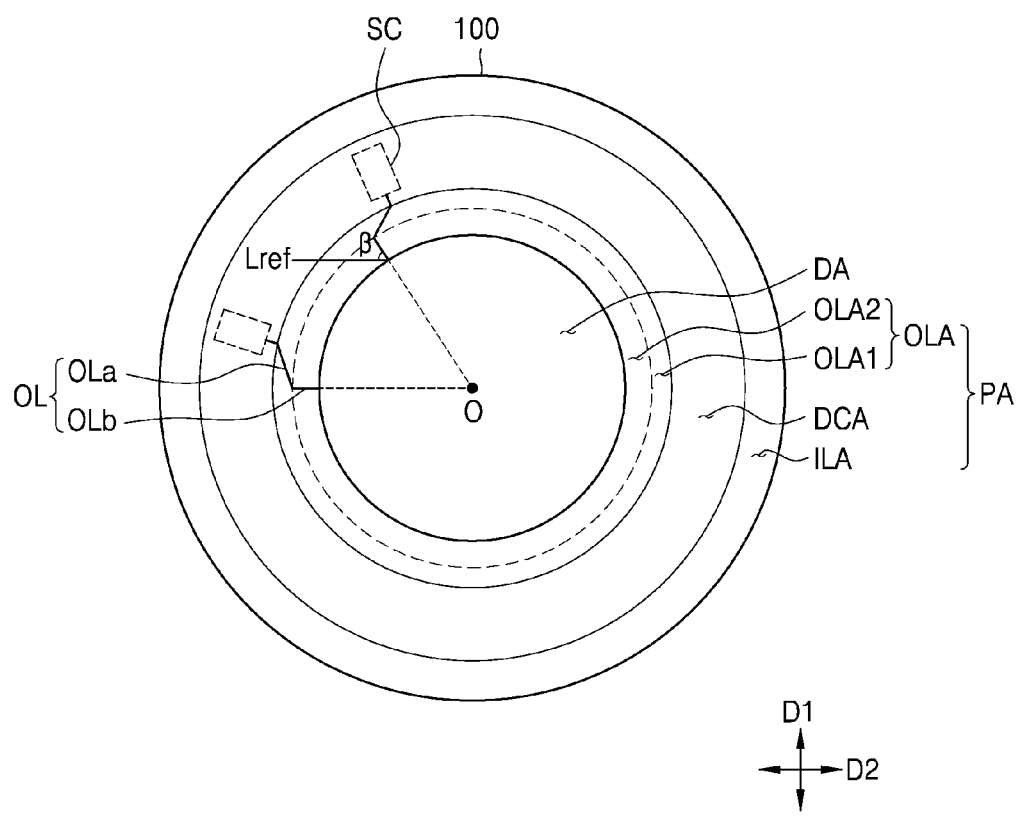
FIG. 18 is a view of an arrangement of output lines according to an embodiment.
Figure 19:
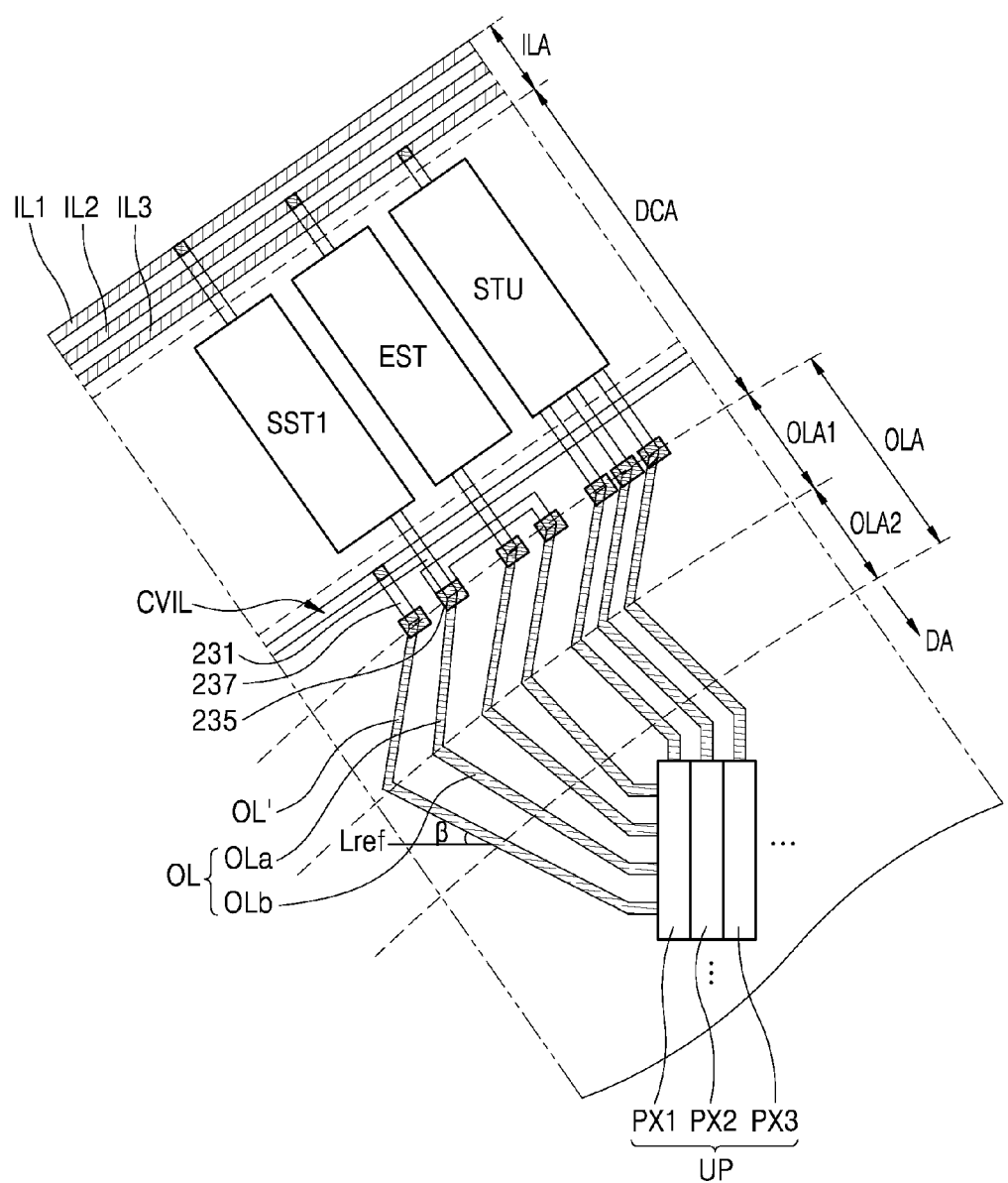
FIG. 19 is an example view of an arrangement of output lines according to an embodiment.

FIG. 18 is a view of an arrangement of output lines according to an embodiment. FIG. 19 is an example view of an arrangement of output lines according to an embodiment.

Referring to FIG. 18, the peripheral area PA of the substrate 100 may include a driving circuit area DCA in which a driving circuit is arranged along the edge of the display area DA. As described with reference to FIGS. 2 and 11, sub-driving circuits SC of a plurality of different driving circuits may be distributed in a mixture in a line in the driving circuit area DCA. The sub-driving circuits SC may include stages SST1 of the first scan driving circuit 120, stages SST2 of the second scan driving circuit 130, stages EST of the emission control circuit 140, sub-demultiplexers SDMUX of the data distribution circuit 160, and sub-test circuits STU of the test circuit 170.

The peripheral area PA of the substrate 100 may further include an input line area ILA between the driving circuit area DCA and the edge of the substrate 100. A plurality of input lines that apply a signal and/or a voltage to the driving circuits may be arranged in the input line area ILA. The input lines may include the input lines 211 (see FIG. 5) of the first scan driving circuit 120, the input lines 213 (see FIG. 6) of the second scan driving circuit 130, the input lines 215 (see FIG. 5) of the emission control circuit 140, the output lines FL that transfer a data signal DATA to the data distribution circuit 160, the signal lines that apply control signals CLA to CLI (see FIGS. 12A and 12B), the signal line that apply a control signal DC_GATE to the test circuit 170, and the input lines 221, 223, and 225 (see FIG. 13) that apply test signals DC_R, DC_G, and DC_B.

The peripheral area PA of the substrate 100 may further include an output line area OLA between the display area DA and the driving circuit area DCA. Output lines OL connecting the sub-driving circuits SC to the pixels PX may be arranged in the output line area OLA. The output lines OL may include first output lines OLs11 and second output lines OLs12 of the first scan driving circuit 120, first output lines OLs21 and second output lines OLs22 of the second scan driving circuit 130, output lines OLe of the emission control circuit 140, first to third output lines OLd1, OLd2, and OLd3 of the data distribution circuit 160, and first to third output lines OLt1, OLt2, and OLt3 of the test circuit 170. Each of the first output lines OLs11 and the second output lines OLs12 of the first scan driving circuit 120 may be electrically connected to the first scan line SL1 and the second scan line SL2 on a corresponding row. Each of the first output lines OLs21 and the second output lines OLs22 of the second scan driving circuit 130 may be electrically connected to the third scan line SL3 and the fourth scan line SL4 on a corresponding row. Each of the output lines OLe of the emission control circuit 140 may be electrically connected to the emission control line EL on a corresponding row. Each of the first to third output lines OLd1, OLd2, and OLd3 of the data distribution circuit 160 may be electrically connected to the data line DL on a corresponding column. Each of the first to third output lines OLt1, OLt2, and OLt3 of the test circuit 170 may be electrically connected to the data line DL on a corresponding column.

The output line area OLA may include a first output line area OLA1 and a second output line area OLA2, the first output line area OLA1 neighboring (e.g., adjacent to) the driving circuit area DCA, and the second output line area OLA2 neighboring (e.g., adjacent to) the display area DA. Each of the output lines OL may include a first portion OLa and a second portion OLb, the first portion OLa being arranged in the first output line area OLA1, and second portion OLb being arranged in the second output line area OLA2. The first portion OLa of each output line OL may extend in a predetermined or set direction in the first output line area OLA1, and the second portion OLb that is bent from the first portion OLa may extend toward a center O of the display area DA in the second output line area OLA2. For example, extension lines respectively of the second portions OLb of the output lines OL may converge to the center O of the display area DA. The second portions OLb of the output lines OL may be inclined by a fourth angle β with respect to the reference line Lref. The fourth angle β may depend on a location of the output lines OL.

In an embodiment, because output lines connected to the sub-driving circuits SC of the driving circuits are bent at a boundary between the first output line area OLA1 and the second output line area OLA2 and have directionality in the second output line area OLA2, an unconnectable area in which the sub-driving circuit SC is not connected to a pixel PX may not occur.

FIG. 19 shows, as an example, the sub-test circuit STU of the test circuit 170, the stage SST1 of the first scan driving circuit 120, and the stage EST of the emission control circuit 140 as three sub-driving circuits SC arranged in a line in the driving circuit area DCA.

A plurality of input lines may be arranged in the input line area ILA. In some embodiments, one input line may be connected to each sub-driving circuit SC. In other embodiments, a plurality of input lines may be connected to each sub-driving circuit SC. For example, as shown in FIG. 19, first input lines IL1, second input lines IL2, and third input lines IL3 may be apart (e.g., spaced apart) from each other by a predetermined interval or set distance in the input line area ILA. Further, the first input lines IL1 may be connected to the stage SST1 of the first scan driving circuit 120, the second input lines IL2 may be connected to the stage EST of the emission control circuit 140, and the third input lines IL3 may be connected to the sub-test circuit STU of the test circuit 170. The first input lines IL1 and the second input lines IL2 may include a plurality of voltage lines and a plurality of clock lines. The third input lines IL3 may include a plurality of signal lines that apply a control signal DC_GATE and test signals DC_R, DC_G, and DC_B to the sub-test circuit STU.

The output lines OL may be apart from each other in the output line area OLA, the output lines OL connecting the sub-driving circuits SC to the first to third pixels PX1, PX2, and PX3. The output lines OL may be connected to the sub-driving circuit SC by a conductive line 231 and a connection pad 235 of the sub-driving circuits SC. The first portions OLa of the output lines OL may be apart (e.g., spaced apart) from each other so that they do not intersect each other and may extend in a predetermined or set direction depending on the arrangement of the sub-driving circuits SC. The second portions OLb of the output lines OL may be bent at the boundary between the first output line area OLA1 and the second output line area OLA2 and may extend, in the second output line area OLA2, toward a center O (also referred to as an origin O).

FIG. 19 shows an embodiment in which a scan signal output from a conductive line 231 of the stage SST1 of the first scan driving circuit 120 is divided and transferred to two output lines, and the two output lines are respectively electrically connected to the first scan line SL1 and the second scan line SL2.

A common initialization voltage line CVIL may be further arranged in the driving circuit area DCA along the edge of the display area DA. The common initialization voltage line CVIL may apply the initialization voltage Vint to the initialization voltage line VIL of a pixel PX. In the driving circuit area DCA, a conductive line 237 connected to the common initialization voltage line CVIL may be connected to an output line OL' by the connection pad 235, and the output line OL' may be electrically connected to the initialization voltage line VIL of the pixel PX. Like other output lines OL, the output lines OL' connected to the common initialization voltage line CVIL may include a first portion OLa and a second portion OLb, and an extension line of the second portion OLb of each output line OL' may pass through (e.g., extend toward) the origin O of the display area DA.

Figure 20:
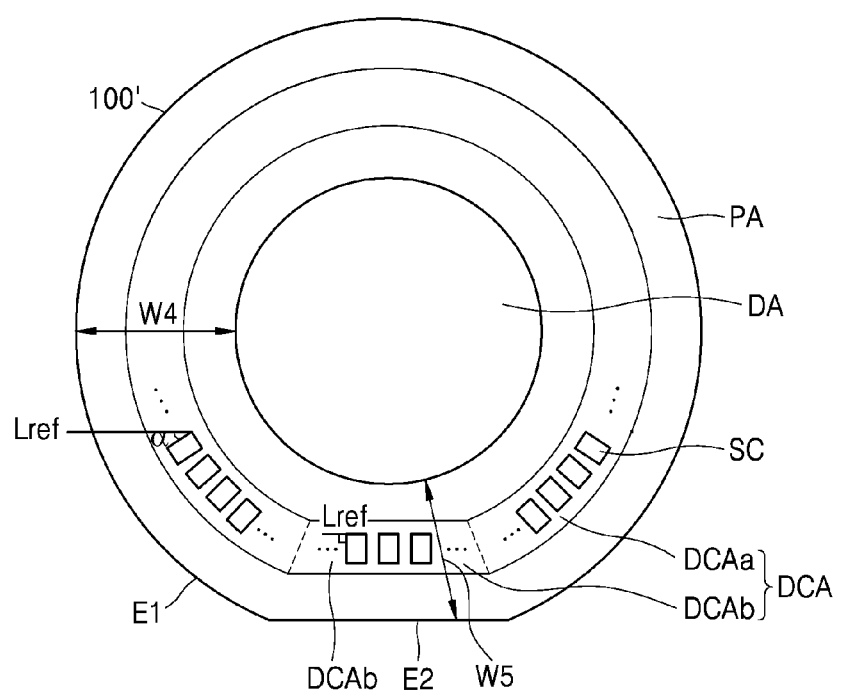
FIGS. 20 to 22 are views of a display panel of a display device according to another embodiment.
Figure 21:
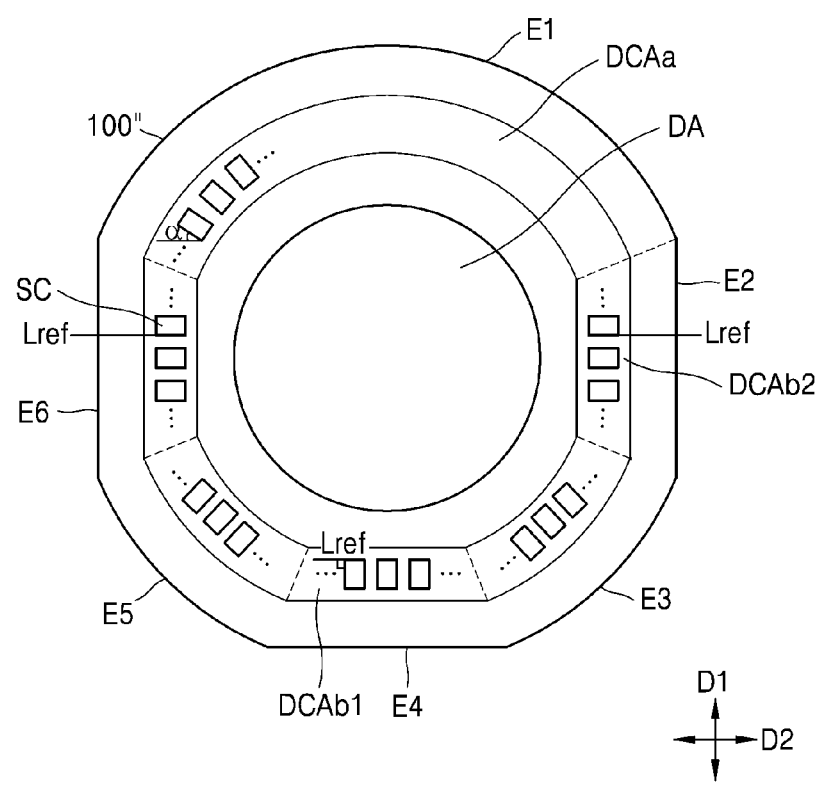
Figure 22:
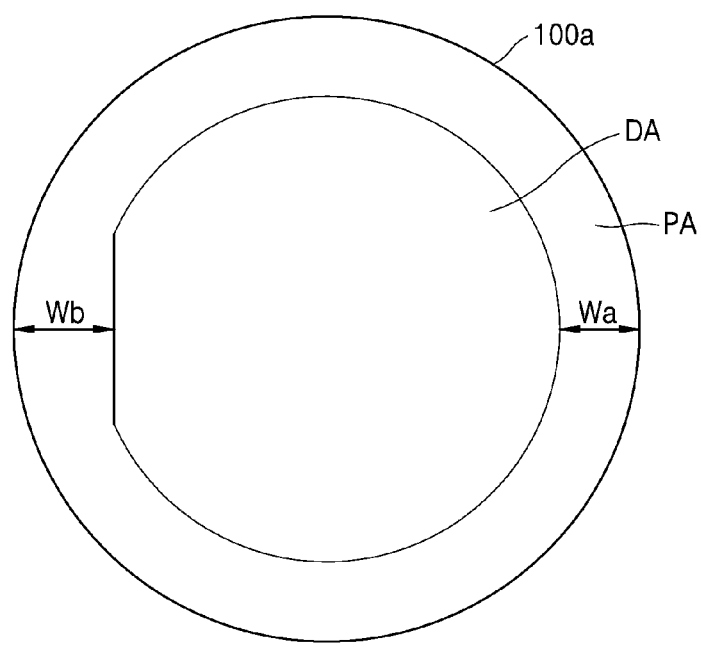

FIGS. 20 to 22 are views of a display panel of a display device according to another embodiment.

Referring to FIG. 20, a substrate 100' of the display panel according to an embodiment may have a non-quadrangular shape including a circular portion. The substrate 100' may include a first edge E1 that is circular and a second edge E2 that is a straight line. The display area DA may be circular as a whole. The peripheral area PA surrounding the display area DA may include an area having a shape corresponding to the shape of the display area DA, and an area having a shape different from the shape of the display area DA.

The driving circuit area DCA may include a first driving circuit area DCAa that is circular, and a second driving circuit area DCAb that has a straight line shape. The first driving circuit area DCAa may be included in the peripheral area PA having a shape corresponding to the shape of the display area DA, and the second driving circuit area DCAb may be included in the peripheral area PA having a shape different from the shape of the display area DA. For example, the display area DA is circular, but the driving circuit area DCA may include an area having a shape corresponding to the shape of the display area DA, and an area having a shape different from the shape of the display area DA.

Sub-driving circuits SC arranged in the first driving circuit area DCAa may be inclined by a predetermined or set angle α with respect to the reference line Lref. Sub-driving circuits SC arranged in the second driving circuit area DCAb may be arranged at 90° with respect to the reference line Lref. A width W5 of the peripheral area PA in which the second driving circuit area DCAb is located may be less than a width W4 of the peripheral area PA in which the first driving circuit DCAa is located. Therefore, the peripheral area PA of the display area DA, which may be a dead space, may be reduced.

As shown in FIG. 21, one or more peripheral areas PA having a shape different from the shape of the display area DA may be between the peripheral areas PA having a shape corresponding to the shape of the display area DA. Similarly, two or more second driving circuit areas DCAb having a shape different from the shape of the display area DA may be between the first driving circuit areas DCAa. The second driving circuit areas DCAb may include at least one second driving circuit area DCAb1 and at least one second driving circuit area DCAb2, the second driving circuit area DCAb1 being arranged at 90° with respect to the reference line Lref, and the second driving circuit area DCAb2 being arranged at 0° with respect to the reference line Lref. In FIG. 21, a substrate 100" may include a first edge E1, a third edge E3, and a fifth edge E5 that are circular. The substrate 100" may also have a second edge E2, a fourth edge E4, and a sixth edge E6 that have a straight line shape. Though the display area DA is circular as a whole, the driving circuit area DCA may include some areas having a shape different from the shape of the display area DA depending on a shape of the substrate 100".

FIG. 22 is a view of a display panel of a display device according to another embodiment.

Referring to FIG. 22, a substrate 100*a* of the display panel according to an embodiment may have a non-quadrangular shape in which a portion thereof is circular. The substrate 100*a* may be circular as a whole. The substrate 100*a* may include the display area DA and the peripheral area PA surrounding the display area DA. The display area DA may have a circular shape as a whole, but a portion of the display area DA may have a straight line shape.

In FIG. 22, a portion of a left edge of the display area DA has a straight line shape and thus a shape and a size of a peripheral area PA on the left may be different from a size and a shape of a peripheral area PA on the right. In another embodiment, a portion of an edge on one side among left, right, up, and down edges of the display area DA may have a straight line shape.

A width Wb of a peripheral area PA surrounding an edge of the display area DA that has a straight line shape may be greater than a width Wa of a peripheral area PA surrounding an edge of the display area DA that has a circular shape. Pads electrically connected to a flexible printed circuit board (FPCB) may be arranged in the peripheral area PA surrounding the edge of the display area DA that has a straight line shape. The FPCB may include a driver for driving an input sensing member (e.g., a touch panel). An area in which the pads may be arranged may be a predetermined or set region between the sub-driving circuits SC distributed in the peripheral area PA.

According to an embodiment, because the pixel circuit that drives the display element includes the first thin film transistor TFT1, including a silicon semiconductor, and the second thin film transistor TFT2, including an oxide semiconductor, a high-resolution display device with low power consumption may be provided.

According to an embodiment, a display device may reduce an area of a peripheral area and symmetrically arrange driving circuits in left and right peripheral areas by arranging the driving circuits in a line in the peripheral area. The driving circuits may output different signals for driving a pixel in which thin film transistors, including different semiconductors, are mixed. Embodiments of the present disclosure are also applicable to the arrangement of driving circuits outputting different signals for driving a pixel, including thin film transistors that include a single semiconductor.

According to an embodiment, a display device may improve the arrangement of driving circuits by allowing output lines to have directionally. The output lines may connect the driving circuits to signal lines, and the signal lines may be connected to pixels.

According to an embodiment, a display device having a reduced area of a peripheral area by providing a portion of the peripheral area that has a shape different from a shape of a display area. The driving circuits may be arranged in this portion of the peripheral area, which is the peripheral area surrounding the display area. Peripheral areas facing a display area may be symmetrical to each other in an embodiment or may not be symmetrical to each other in another embodiment. In either case, driving circuits and an integrated circuit chip may be arranged in the peripheral area such that a size (a width) of the peripheral areas is minimized or reduced.

According to an embodiment, because different driving circuits arranged around a display area may be distributed in a mixture, a dead space of a display device may be reduced. However, the scope of the present disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and equivalents thereof.

What is claimed is:

1. A display device comprising:
a plurality of pixels arranged in a display area that has a non-quadrangular shape;
a first driving circuit including a plurality of first sub-driving circuits each to output a first signal to the plurality of pixels;
a second driving circuit including a plurality of second sub-driving circuits each to output a second signal to the plurality of pixels; and
a third driving circuit including a plurality of third sub-driving circuits each to output a third signal to the plurality of pixels,
wherein a peripheral area outside the display area includes a first peripheral area and a second peripheral area that are symmetrical to each other with respect to the display area therebetween,
the plurality of first sub-driving circuits and the plurality of second sub-driving circuits are alternately arranged in a line in the first peripheral area,
the plurality of third sub-driving circuits are arranged in a line in the second peripheral area, and
a sum of a size of an area in which one of the plurality of first sub-driving circuits is arranged and a size of an area in which one of the plurality of second sub-driving circuits is arranged is equal to a size of an area in which one of the plurality of third sub-driving circuits is arranged.

2. The display device of claim 1, wherein,
each of the plurality of pixels includes a first thin film transistor, a second thin film transistor, and a third thin film transistor, the first thin film transistor and the second thin film transistor each including a silicon semiconductor, and the third thin film transistor including an oxide semiconductor.

3. The display device of claim 2, wherein,
the plurality of first sub-driving circuits are connected to a first signal line connected to a gate electrode of the first thin film transistor and extend in a first direction,
the plurality of second sub-driving circuits are connected to a second signal line connected to a gate electrode of the second thin film transistor and extend in the first direction, and
the plurality of third sub-driving circuits are connected to a third signal line connected to a gate electrode of the third thin film transistor and extend in the first direction.

4. The display device of claim 3, wherein,
each of the plurality of pixels is connected to a fourth signal line extending in a second direction intersecting the first direction,
the display device further includes: a fourth driving circuit including a plurality of fourth sub-driving circuits that output a fourth signal to one end portion of the fourth signal lines; and
a fifth driving circuit including a plurality of fifth sub-driving circuits that output a fifth signal to another end portion of the fourth signal lines, and
the plurality of fourth sub-driving circuits and the plurality of fifth sub-driving circuits are distributed in the first peripheral area and the second peripheral area.

5. The display device of claim 4, wherein,
the plurality of fourth sub-driving circuits and the plurality of fifth sub-driving circuits are distributed between the plurality of first to third sub-driving circuits.

6. The display device of claim 4, wherein,
the plurality of fourth sub-driving circuits and the plurality of fifth sub-driving circuits are arranged between pairs of the first sub-driving circuit and the second sub-driving circuit.

7. The display device of claim 4, further comprising:
a plurality of output lines arranged in the peripheral area and connecting the first to fourth signal lines to the plurality of first to fifth driving circuits.

8. The display device of claim 7, wherein,
each of the plurality of output lines includes a portion extending in a direction toward a center of the display area.

9. The display device of claim 1, wherein,
the peripheral area has a shape corresponding to a shape of an edge of the display area.

10. The display device of claim 1, wherein,
the peripheral area includes an area having a shape corresponding to a shape of an edge of the display area, and an area having a shape different from the shape of the edge of the display area.

11. The display device of claim 10, wherein,
a width of the area of the peripheral area having a shape different from the shape of the edge of the display area is less than a width of the area of the peripheral area having a shape corresponding to the shape of the edge of the display area.

12. A display device comprising:
a plurality of signal lines extending in a first direction and arranged in a display area that has a non-quadrangular shape;
a plurality of driving circuits arranged in a peripheral area outside the display area and to output a signal to the plurality of signal lines; and
a plurality of output lines arranged in the peripheral area and connecting the plurality of driving circuits to the plurality of signal lines,
wherein a plurality of sub-driving circuits included in each of the plurality of driving circuits are arranged in a line in the peripheral area, and
each of the plurality of output lines includes a portion extending in a direction toward a center of the display area, a virtual extension of the portion crossing the center of the display area.

13. The display device of claim 12, wherein,
the peripheral area has a shape corresponding to a shape of an edge of the display area.

14. The display device of claim 12, wherein,
the peripheral area includes an area having a shape corresponding to a shape of an edge of the display area, and an area having a shape different from the shape of the edge of the display area.

15. The display device of claim 14, wherein,
a width of the area of the peripheral area having a shape different from the shape of the edge of the display area is less than a width of the area of the peripheral area having a shape corresponding to the shape of the edge of the display area.

16. The display device of claim 12, wherein,
a plurality of pixels connected to the plurality of signal lines are arranged in the display area, and
each of the plurality of pixels includes a first thin film transistor, a second thin film transistor, and a third thin film transistor, the first thin film transistor and the second thin film transistor each including a silicon semiconductor, and the third thin film transistor including an oxide semiconductor.

17. A display device comprising:
a plurality of signal lines extending in a first direction and arranged in a display area that has a non-quadrangular shape;
a plurality of driving circuits arranged in a peripheral area outside the display area and to output a signal to the plurality of signal lines; and
a plurality of output lines arranged in the peripheral area and connecting the plurality of driving circuits to the plurality of signal lines,
wherein:
a plurality of sub-driving circuits included in each of the plurality of driving circuits are arranged in a line in the peripheral area,
each of the plurality of output lines includes a portion extending in a direction toward a center of the display area,
the plurality of signal lines include a plurality of first signal lines, a plurality of second signal lines, and a plurality of third signal lines,
the plurality of sub-driving circuits include a plurality of first sub-driving circuits to output a first signal to the plurality of first signal lines, a plurality of second sub-driving circuits to output a second signal to the plurality of second signal lines, and a plurality of third sub-driving circuits to output a third signal to the plurality of third signal lines,
the peripheral area includes a first peripheral area and a second peripheral area that are symmetrical to each other with respect to the display area therebetween,
the plurality of first sub-driving circuits and the plurality of second sub-driving circuits are alternately arranged in a line in the first peripheral area,
the plurality of third sub-driving circuits are arranged in a line in the second peripheral area, and
a sum of a size of an area in which one of the plurality of first sub-driving circuits is arranged and a size of an area in which one of the plurality of second sub-driving circuits is arranged is equal to a size of an area in which one of the plurality of third sub-driving circuits is arranged.

18. The display device of claim 17, wherein, the plurality of signal lines further include fourth signal lines extending in a second direction intersecting the first direction and arranged in the display area, the plurality of sub-driving circuits further include a plurality of fourth sub-driving circuits to output a fourth signal to an end portion of the fourth signal lines, and a plurality of fifth sub-driving circuits to output a fifth signal to another end portion of the fourth signal lines, and the plurality of fourth sub-driving circuits and the plurality of fifth sub-driving circuits are distributed in the first peripheral area and the second peripheral area.

19. The display device of claim 18, wherein, the plurality of fourth sub-driving circuits and the plurality of fifth sub-driving circuits are distributed between the plurality of first to third sub-driving circuits.

20. The display device of claim 18, wherein the plurality of fourth sub-driving circuits and the plurality of fifth sub-driving circuits are arranged between pairs of the first sub-driving circuit and the second sub-driving circuit.

\* \* \* \* \*